United States Patent
Lee et al.

(10) Patent No.: US 9,377,955 B2
(45) Date of Patent: Jun. 28, 2016

(54) ELECTRONIC DEVICE INCLUDING A SEMICONDUCTOR MEMORY UNIT THAT INCLUDES CELL MATS OF A PLURALITY OF PLANES VERTICALLY STACKED

(71) Applicant: SK HYNIX INC., Icheon (KR)

(72) Inventors: Seung-Hwan Lee, Icheon (KR); Hyun-Jeong Lee, Icheon (KR)

(73) Assignee: SK HYNIX INC., Icheon (KR)

( * ) Notice: Subject to any disclaimer, the term of this patent is extended or adjusted under 35 U.S.C. 154(b) by 48 days.

(21) Appl. No.: 14/449,062

(22) Filed: Jul. 31, 2014

(65) Prior Publication Data

US 2015/0261437 A1     Sep. 17, 2015

(30) Foreign Application Priority Data

Mar. 11, 2014     (KR) .................. 10-2014-0028322

(51) Int. Cl.
    *G06F 3/00*      (2006.01)
    *H01L 47/00*     (2006.01)
    *G06F 3/06*      (2006.01)
    *H01L 27/24*     (2006.01)
    *H01L 45/00*     (2006.01)
    (Continued)

(52) U.S. Cl.
    CPC .............. *G06F 3/061* (2013.01); *G06F 3/0659* (2013.01); *G06F 3/0679* (2013.01); *G11C 13/0002* (2013.01); *H01L 27/222* (2013.01); *H01L 27/2481* (2013.01); *H01L 45/06* (2013.01); *H01L 45/08* (2013.01); *H01L 45/141* (2013.01); *H01L 45/146* (2013.01); *H01L 45/147* (2013.01); *G11C 13/0009* (2013.01); *G11C 2213/71* (2013.01); *G11C 2213/77* (2013.01)

(58) Field of Classification Search
    CPC ....... G06F 3/06; G06F 3/0659; G06F 3/0679; H01L 45/08; H01L 45/06; H01L 45/147; H01L 27/222; H01L 45/141; H01L 45/146; H01L 27/2481; G11C 13/0002; G11C 2213/71; G11C 2213/77; G11C 13/0009
    See application file for complete search history.

(56) References Cited

U.S. PATENT DOCUMENTS

| 4,933,941 A * | 6/1990 | Eckard ................ G06F 11/2736 714/31 |
| 7,859,885 B2 * | 12/2010 | Toda ........................ G11C 8/08 365/100 |

(Continued)

OTHER PUBLICATIONS

"512Mb PROM with 8 Layers of Antifuse/Diode Cells" by Matthew Crowley et al., 2003 IEEE International Solid-State Circuits Conference.*

(Continued)

*Primary Examiner* — Jing-Yih Shyu

(57) ABSTRACT

An electronic device includes a semiconductor memory. The semiconductor memory includes a plurality of planes vertically stacked over a substrate. Each plane includes one or more cell mats. Each cell mat includes lower lines, upper lines crossing the lower lines, and variable resistance elements positioned in intersection regions of the lower lines and the upper lines, respectively. Lower contacts are coupled to the lower lines, respectively, and, in a plan view, overlap with a boundary region between half of the upper lines and the other half number of the upper lines. Upper contacts are coupled to the upper lines, respectively, and overlap with a boundary region between a half number of the lower lines and the other half number of the lower lines. One cell mat of an upper plane is vertically stacked over a lower plane to overlap with two adjacent cell mats of the lower plane.

14 Claims, 15 Drawing Sheets

(51) Int. Cl.
*H01L 27/22* (2006.01)
*G11C 13/00* (2006.01)

(56) References Cited

U.S. PATENT DOCUMENTS

| | | | | |
|---|---|---|---|---|
| 8,369,127 B2* | 2/2013 | Maejima | ............ | G11C 5/02 |
| | | | | 365/148 |
| 8,605,506 B2* | 12/2013 | Maejima | ............ | G11C 5/02 |
| | | | | 365/185.05 |
| 2006/0197115 A1* | 9/2006 | Toda | ............ | G11C 5/02 |
| | | | | 257/248 |
| 2007/0252193 A1* | 11/2007 | Cho | ............ | G11C 11/5685 |
| | | | | 257/315 |
| 2009/0174032 A1* | 7/2009 | Maejima | ............ | G11C 13/00 |
| | | | | 257/536 |
| 2010/0032641 A1* | 2/2010 | Mikawa | ............ | G11C 13/0007 |
| | | | | 257/3 |
| 2011/0114912 A1* | 5/2011 | Mikawa | ............ | H01L 27/101 |
| | | | | 257/4 |
| 2012/0147649 A1* | 6/2012 | Samachisa | ............ | G11C 13/0002 |
| | | | | 365/51 |
| 2012/0193600 A1* | 8/2012 | Himeno | ............ | H01L 27/2409 |
| | | | | 257/4 |
| 2013/0015423 A1* | 1/2013 | Mikawa | ............ | H01L 27/2409 |
| | | | | 257/4 |
| 2013/0248813 A1* | 9/2013 | Fujii | ............ | H01L 27/101 |
| | | | | 257/4 |
| 2015/0089087 A1* | 3/2015 | Kim | ............ | G11C 13/0002 |
| | | | | 710/5 |

OTHER PUBLICATIONS

"512-Mb PROM With a Three-Dimensional Array of Diode/Antifuse Memory Cells" by Mark Johnson et al., IEEE Journal of Solid-State Circuits, Vol. 38, No. 11, Nov. 2003.*

* cited by examiner

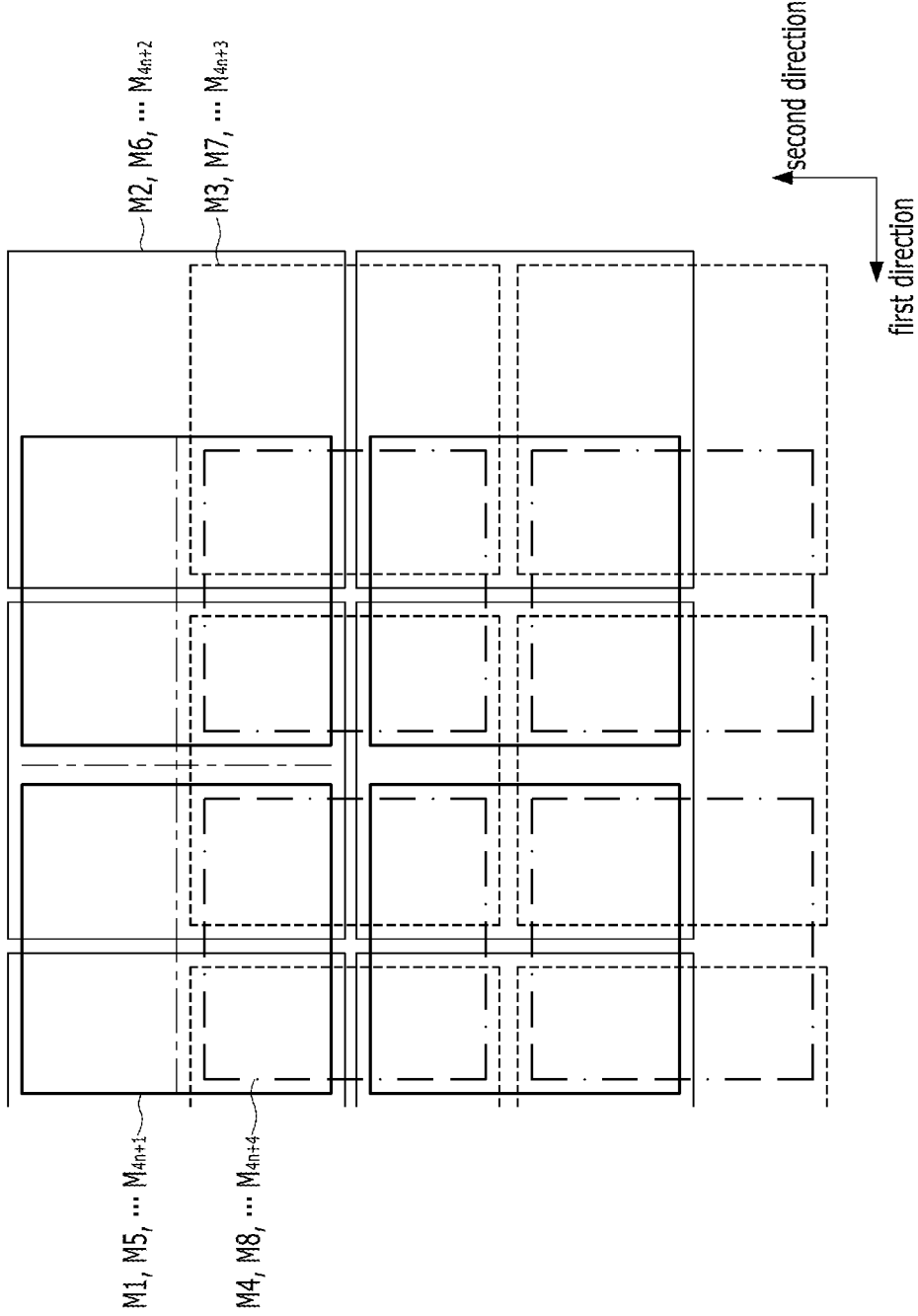

ELECTRONIC DEVICE INCLUDING A SEMICONDUCTOR MEMORY UNIT THAT INCLUDES CELL MATS OF A PLURALITY OF PLANES VERTICALLY STACKED

CROSS-REFERENCE TO RELATED APPLICATION

The present application claims priority to Korean Patent Application No. 10-2014-0028322, entitled "ELECTRONIC DEVICE" and filed on Mar. 11, 2014, which is incorporated by reference herein in its entirety.

TECHNICAL FIELD

This patent document relates to memory circuits or devices and their applications in electronic devices or systems.

BACKGROUND

Recently, as electronic devices or appliances trend toward miniaturization, low power consumption, high performance, multi-functionality, and so on, there is a demand for electronic devices capable of storing information in various electronic devices or appliances such as a computer, a portable communication device, and so on, and research and development for such electronic devices have been conducted. Examples of such electronic devices include electronic devices which can store data using a characteristic switched between different resistant states according to an applied voltage or current, and can be implemented in various configurations, for example, an RRAM (resistive random access memory), a PRAM (phase change random access memory), a FRAM (ferroelectric random access memory), a MRAM (magnetic random access memory), an E-fuse, etc.

SUMMARY

The disclosed technology in this patent document includes memory circuits or devices and their applications in electronic devices or systems and various implementations of an electronic device, in which an electronic device can increase the degree of integration and improve a performance characteristic thereof.

In an embodiment, an electronic device includes a semiconductor memory unit that comprises first to $T^{th}$ planes (T is a natural number of 2 or more) which are sequentially stacked over a substrate, each of the first to $T^{th}$ planes including one or more cell mats, wherein a $t^{th}$ cell mat of a $t^{th}$ plane (t is a natural number and ranges from 1 to T) includes $t^{th}$ lower lines extending in a first direction, $t^{th}$ upper lines disposed over the $t^{th}$ lower lines and extending in a second direction crossing the first direction, and $t^{th}$ variable resistance elements positioned at cross points between the $t^{th}$ lower lines and the $t^{th}$ upper lines, a $t+1^{th}$ cell mat of a $t+1^{th}$ plane overlaps with a first half of one of two adjacent $t^{th}$ cell mats which are adjacent to each other in the first direction and a second half of the other of the two adjacent $t^{th}$ cell mats where the second half is adjacent to the first half in the first direction, and includes the $t^{th}$ upper lines disposed in the first half and the second half, $t+1^{th}$ upper lines disposed over the $t^{th}$ upper lines and extending in the first direction, and $t+1^{th}$ variable resistance elements positioned at cross points between the $t^{th}$ upper lines and the $t+1^{th}$ upper lines, and a $t^{th}$ lower contact coupled to each of the $t^{th}$ lower lines, a $t^{th}$ upper contact coupled to each of the $t^{th}$ upper lines, and a $t+1^{th}$ upper contact coupled to each of the $t+1^{th}$ upper lines overlap with a middle of each of the $t^{th}$ lower lines, a middle of each of the $t^{th}$ upper lines, and a middle of each of the $t+1^{th}$ upper lines, respectively.

Embodiments of the above device may include one or more of the following.

The $t+1^{th}$ upper contact is positioned between the two adjacent $t^{th}$ cell mats. A combination of the $t^{th}$ lower contact and the $t^{th}$ lower line, a combination of the $t^{th}$ upper contact and the $t^{th}$ upper line, and a combination of the $t+1^{th}$ upper contact and the $t+1^{th}$ upper line have T-shaped cross-sections, respectively. When each of the $t^{th}$ cell mat and the $t+1^{th}$ cell mat is divided into four quadrants, the $t^{th}$ lower contact, the $t^{th}$ upper contact, and the $t+1^{th}$ upper contact are positioned at boundaries of the four quadrants. The number of the $t^{th}$ variable resistance elements disposed at one side of the $t^{th}$ lower contact is same as the number of the $t^{th}$ variable resistance elements disposed at the other side of the $t^{th}$ lower contact, the number of the $t^{th}$ variable resistance elements disposed at one side of the $t^{th}$ upper contact is same as the number of the $t^{th}$ variable resistance elements disposed at the other side of the $t^{th}$ upper contact, the number of the $t+1^{th}$ variable resistance elements disposed at one side of the $t^{th}$ upper contact is same as the number of the $t+1^{th}$ variable resistance elements disposed at the other side of the $t^{th}$ upper contact, and the number of the $t+1^{th}$ variable resistance elements disposed at one side of the $t+1^{th}$ upper contact is same as the number of the $t+1^{th}$ variable resistance elements disposed at the other side of the $t+1^{th}$ upper contact. $4n+1^{th}$ planes (n is an integer of 0 or more) of the first to $T^{th}$ planes overlap with each other, $4n+2^{th}$ planes of the first to $T^{th}$ planes overlap with each other, $4n+3^{th}$ planes of the first to $T^{th}$ planes overlap with each other, and $4n+4^{th}$ planes of the first to $T^{th}$ planes overlap with each other, in a plan view. The semiconductor memory unit further comprises a selection element interposed between the $t^{th}$ variable resistance element and the $t^{th}$ lower line, between the $t^{th}$ variable resistance element and the $t^{th}$ upper line, between the $t+1^{th}$ variable resistance element and the $t^{th}$ upper line, and/or between the $t+1^{th}$ variable resistance element and the $t+1^{th}$ upper line. A $t+2^{th}$ cell mat of a $t+2^{th}$ plane overlaps with a first quarter of a first one of four adjacent $t^{th}$ cell mats which are adjacent to each other in the first and second directions, a second quarter of a second one of the four adjacent $t^{th}$ cell mats, a third quarter of a third one of the four adjacent $t^{th}$ cell mats, and a fourth quarter of a fourth one of the four adjacent $t^{th}$ cell mats where the first to fourth quarters are adjacent to each other in the first and second directions, and a $t+3^{th}$ cell mat of a $t+3^{th}$ plane overlaps with a first half of one of two adjacent $t^{th}$ cell mats which are adjacent to each other in the second direction and a second half of the other of the two adjacent $t^{th}$ cell mats where the second half is adjacent to the first half in the second direction.

In another embodiment, an electronic device includes a semiconductor memory unit that comprises a cell mat which is disposed over a substrate and includes lower lines, upper lines crossing the lower lines and variable resistance elements positioned at cross points between the lower lines and the upper lines, where the cell mat has a first boundary positioned between a half of the lower lines and the other half of the lower lines and a second boundary positioned between a half of the upper lines and the other half of the upper lines; a lower contact coupled to each of the lower lines and overlapping with the second boundary; and an upper contact coupled to each of the upper lines and overlapping with the first boundary.

In the above device, a combination of the lower contact and the lower line, and a combination of the upper contact and the upper line may have T-shaped cross-sections, respectively.

The electronic device may further include a microprocessor which includes: a control unit configured to receive a signal including a command from an external device, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory unit is part of the memory unit in the microprocessor.

The electronic device may further include a processor which includes: a core unit configured to perform, based on a command inputted from an external device, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory unit is part of the cache memory unit in the processor.

The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the external device, wherein the semiconductor memory unit is part of the auxiliary memory device or the main memory device in the processing system.

The electronic device may further include a data storage system which includes: a storage device configured to store data and conserve stored data regardless of power supply; a controller configured to control input and output of data to and from the storage device according to a command inputted from an external device; a temporary storage device configured to temporarily store data exchanged between the storage device and the external device; and an interface configured to perform communication between at least one of the storage device, the controller and the temporary storage device and the external device, wherein the semiconductor memory unit is part of the storage device or the temporary storage device in the data storage system.

The electronic device may further include a memory system which includes: a memory configured to store data and conserve stored data regardless of power supply; a memory controller configured to control input and output of data to and from the memory according to a command inputted from an external device; a buffer memory configured to buffer data exchanged between the memory and the external device; and an interface configured to perform communication between at least one of the memory, the memory controller and the buffer memory and the external device, wherein the semiconductor memory unit is part of the memory or the buffer memory in the memory system.

These and other aspects, implementations and associated advantages are described will become apparent in view of the drawings and the description of embodiments provided herein, which are intended to provide further explanation of the invention as claimed.

BRIEF DESCRIPTION OF THE DRAWINGS

FIG. 5 illustrates a semiconductor device including 5 or more planes in accordance with an embodiment of the present disclosure.

DETAILED DESCRIPTION

Figure 1A:
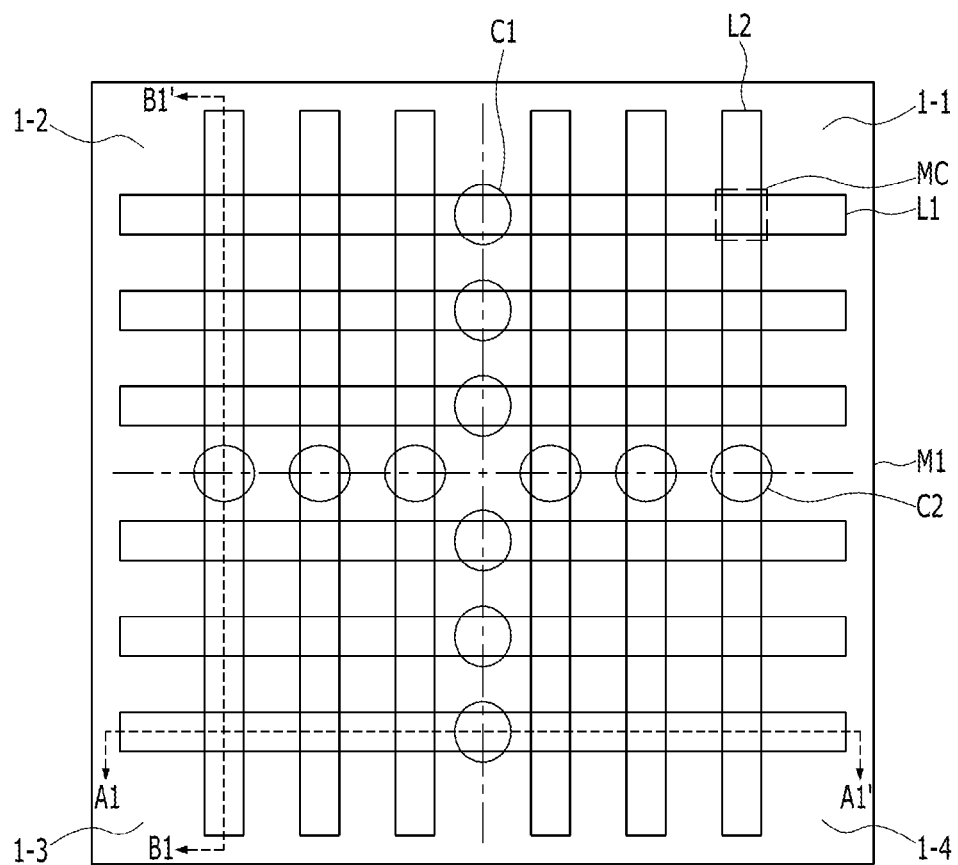
FIG. 1A is a plan view illustrating a semiconductor device including a cell mat in accordance with an embodiment of the present disclosure.

Various embodiments of the present disclosure will be described below with reference to the accompanying drawings.

The drawings may not be necessarily to scale and in some instances, proportions of at least some structures in the drawings may be exaggerated in order to clearly illustrate certain features of embodiments. In presenting an embodiment in a drawing or description having two or more layers in a multi-layer structure, the relative positioning relationship of such layers or the sequence in which the layers are arranged reflects a particular implementation of an embodiment and a different relative positioning relationship or sequence of arranged layers may be possible. In addition, a description or illustration of an embodiment of a multi-layer structure may not reflect all layers present in that particular multi-layer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate, but may also represent a structure where one or more other intermediate layers exist between the first layer and the second layer or the substrate.

Figure 1B:
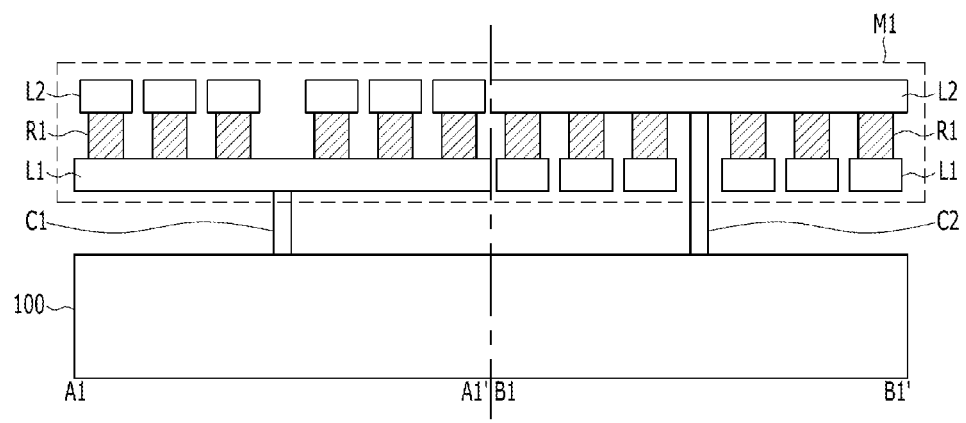
FIG. 1B is a cross-sectional view taken along lines A1-A1' and B1-B1' of FIG. 1A.

FIG. 1A is a plan view illustrating a semiconductor device including a cell mat in accordance with an embodiment of the present disclosure, and FIG. 1B is a cross-sectional view taken along lines A1-A1' and B1-B1' of FIG. 1A.

Referring to FIGS. 1A and 1B, the semiconductor device includes a substrate 100 including a predetermined structure (not shown) and a cell mat M1 disposed over the substrate 100. The cell mat M1 includes a plurality of lower lines L1, a plurality of upper lines L2, and variable resistance elements R1. The plurality of lower lines L1 extends in a first direction, which is parallel to a surface of the substrate 100, and, for example, parallel to the line A1-A1'. The plurality of upper lines L2 is disposed over the lower lines L1 and extends in a second direction which is parallel to the same surface of the substrate 100 and crosses the first direction. For example, the upper lines L2 extend parallel to the line B1-B1'. The variable resistance elements R1 are interposed between the lower lines L1 and the upper lines L2 and positioned at cross points, i.e., in intersection regions, of the lower lines L1 and the upper lines L2, respectively.

A lower line L1 and an upper line L2 are coupled to a bottom end and a top end of a corresponding variable resistance element R1, respectively, and supply a voltage or current to the variable resistance element R1. The lower line L1 and the upper line L2 may be formed of one or more conductive materials, e.g., a metal, a metal nitride, a semiconductor material doped with an impurity, or a combination thereof.

The variable resistance element R1 may be formed of a material that switches between different resistance states depending on a voltage or current applied thereto. In an embodiment, the variable resistance element R1 includes one of various variable resistance materials that are used in an RRAM, a PRAM, a FRAM, a MRAM, etc. The variable resistance materials include a metal oxide such as a transition metal oxide or a perovskite-based material, a phase change material such as a chalcogenide-based material, a ferroelectric material, a ferromagnetic material, etc.

The variable resistance element R1 may have a single-layered structure or a multi-layered structure in which a plurality of layers is stacked and has a variable resistance characteristic in combination. In an embodiment, the variable resistance element R1 has a double-layered structure which includes an oxygen-deficient metal oxide layer and an oxygen-rich metal oxide layer. The oxygen-rich metal oxide layer may include a material that satisfies a stoichiometric ratio, such as $TiO_2$ or $Ta_2O_5$. The oxygen-deficient metal oxide layer may include a material that is deficient in oxygen compared to a material that satisfies a stoichiometric ratio. The oxygen-deficient metal oxide layer may include $TiO_x$, where x is smaller than 2, or $TaO_y$, where y is smaller than 2.5.

In a double-layered structure, depending on the voltage or current applied to the variable resistance element R1, oxygen vacancies of the oxygen-deficient metal oxide layer may be supplied to the oxygen-rich metal oxide layer so that current paths are formed in the oxygen-rich metal oxide layer. In addition, depending on the current or voltage applied, oxygen vacancies of the oxygen-deficient metal oxide layer may not be supplied into the oxygen-rich metal oxide layer so that current paths formed in the oxygen-rich metal oxide layer disappear. As a result, the resistance state of the variable resistance element R1 may change between a high resistance state and a low resistance state. In an embodiment, the variable resistance element R1 further includes an electrode material in addition to the variable resistance material. The resistance state of the variable resistance element R1 may change to store different data.

A memory cell MC is formed in each intersection region of the lower lines L1 and the upper lines L2. In an embodiment, a variable resistance element R1 has an island structure in an intersection region of a lower line L1 and an upper line L2. Accordingly, a variable resistance element R1 positioned in one intersection region and another variable resistance element R1 positioned in another intersection region may be separated from each other. When the variable resistance element R1 has an island structure, a space for forming contacts C1 and C2, which will be described below, may be provided.

Although not shown, in an embodiment, a selection element may further be interposed between the variable resistance element R1 and the lower line L1 and/or between the variable resistance element R1 and the upper line L2. The selection element may be an element for controlling access to the variable resistance element R1. The selection element may have a nonlinear current-voltage characteristic, and thus the selection element may block a current flow at a voltage lower than a threshold voltage while allowing a gradually increasing current to flow at a voltage higher than the threshold voltage. The selection element may include a diode, a transistor, a varistor, a metal-insulator transition (MIT) element, a tunnel barrier formed of an insulating material, or the like. The selection element may be patterned together with the variable resistance element R1. Accordingly, the selection element may have substantially the same shape as the variable resistance element R1 in a plan view.

Meanwhile, various elements for controlling the supply of a voltage or current to the lower lines L1 and upper lines L2, for example, transistors (not shown), may be formed in and on the substrate 100, and the lower lines L1 and upper lines L2 may be coupled to these elements to receive the voltage or current. For this, lower contacts C1 coupling the substrate 100 including the various elements controlling the voltage supply with the lower lines L1 are disposed between the substrate 100 and the lower lines L1. Upper contacts C2 coupling the substrate 100 including the various elements controlling the voltage supply with the upper lines L2 are disposed between the substrate 100 and the upper lines L2.

In an embodiment, the cell mat M1 is divided into a plurality of parts. For convenience of description, FIG. 1A shows a cell mat M1 divided into four parts, but embodiments are not limited thereto. Embodiments having a cell mat M1 divided into more or less than four parts will be apparent to those skilled in the art in view of the present disclosure, and are within the scope of the present disclosure. When the cell mat M1 is divided into four parts including a first quadrant 1-1, a second quadrant 1-2, a third quadrant 1-3 and a fourth quadrant 1-4, as shown in FIG. 1A, the lower contacts C1 may be positioned at a boundary of the first quadrant 1-1 and the second quadrant 1-2 and at a boundary of the third quadrant 1-3 and the fourth quadrant 1-4, and overlap with the lower lines L1, respectively. That is, in a plan view, each of the lower contacts C1 may overlap with a middle portion of a corresponding one of the lower lines L1, which extends in the first direction. Thus, with respect to the orientation of FIG. 1A, half of memory cells MC in the cell mat M1 are disposed on one side, for example, a left side of the lower contacts C1, and the other half of the memory cells MC are disposed on the other side, for example, a right side of the lower contacts C1.

The upper contacts C2 may be positioned at a boundary of the first quadrant 1-1 and the fourth quadrant 1-4 and at a boundary of the second quadrant 1-2 and the third quadrant 1-3, and overlap with the upper lines L2, respectively. That is, each of the upper contacts C2 may overlap with a middle portion of a corresponding one of the upper lines L2, which extend in the second direction. Thus, with respect to the orientation of FIG. 1A, a half of the memory cells MC in the cell mat M1 is disposed on one side, for example, an upper side of the upper contacts C2, and the other half of the memory cells MC is disposed on the other side, for example, a lower side of the upper contacts C2. As a result, as shown in FIG. 1B, the lower line L1 and the lower contact C1 may form a T-shape in a cross-section in the first direction (e.g., along the line A1-A1'), and the upper line L2 and the upper contact C2 may form a T-shape in a cross-section in the second direction (e.g., along the line B1-B1').

In the related art, contacts coupled to lower lines or upper lines are positioned at the outside of a cell mat, and overlap with end portions of the lower lines or the upper lines. Therefore, when a memory cell far from the contacts operates, for example, when a memory cell located on a side opposite to the end portions of the lines operates, a line resistance and a voltage drop due to the line resistance increase, compared with when another memory cell relatively close to the contacts operates. Therefore, a level of the voltage applied to the memory cell far from the contacts is reduced, and errors may occur during a read operation or a write operation. As a result, it is difficult to increase the number of memory cells in a cell mat. That is, a size of the cell mat cannot be increased.

On the other hand, in accordance with embodiments, contacts are coupled to lines at middle portions of the lines. Therefore, even if a memory cell is located at an outermost position on a cell mat, the distance between the memory cell and the contacts may be reduced in comparison to the related art. As a result, a line resistance and a voltage drop due to the line resistance may be reduced, thereby substantially preventing errors that may occur during a read operation or a write operation. It is possible to increase the number of memory cells in a cell mat, and a size of the cell mat can be increased.

A plurality of cell mats M1 may be provided at the same level in a direction perpendicular to the surface of the substrate 100 (hereinafter, "vertical direction"). This embodiment is shown in FIG. 1C.

Figure 1C:
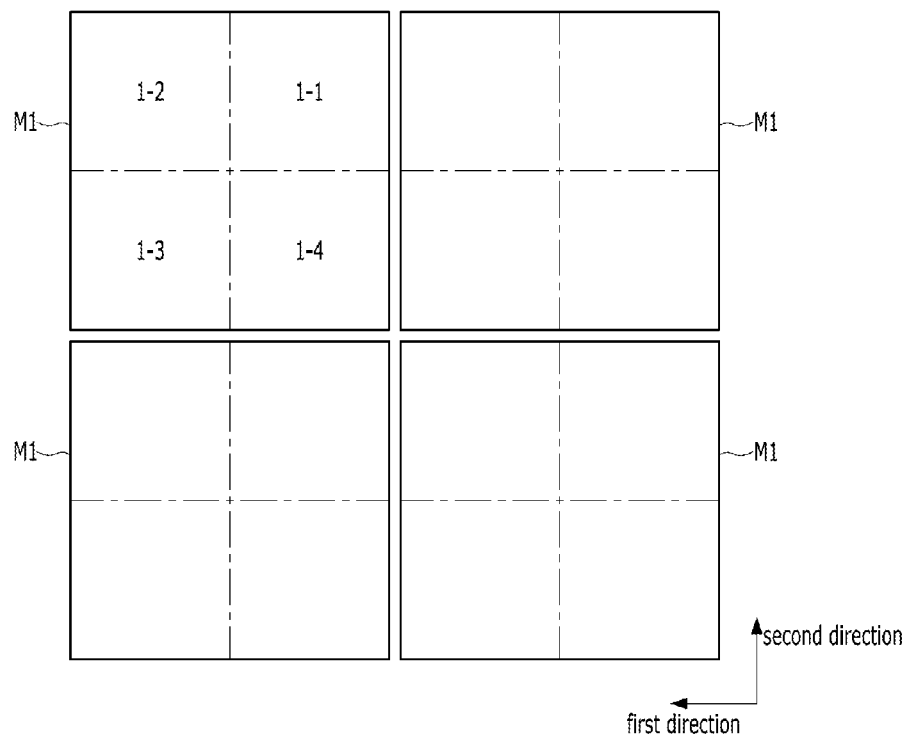
FIG. 1C is a plan view illustrating a semiconductor device including a plurality of cell mats in accordance with an embodiment of the present disclosure.

FIG. 1C is a plan view illustrating a semiconductor device including a plurality of cell mats which are positioned at a same level in a vertical direction in accordance with an embodiment of the present disclosure.

Referring to FIG. 1C, the plurality of cell mats M1 may be arranged in a matrix form including a plurality of rows and columns of cell mats, which extend in the first and second directions, respectively. In the embodiment shown in FIG. 1C, 2×2 cell mats M1 are shown, but the number of cell mats M1 arranged in the first direction and/or the second direction may be changed. Each of the cell mats M1 may have substantially the same configuration as the cell mat M1 of FIG. 1A. That is, each of the cell mats M1 includes a first quadrant 1-1, a second quadrant 1-2, a third quadrant 1-3, a fourth quadrant 1-4, lower contacts C1, upper contacts C2, lower lines L1, and upper lines L2, which are arranged as illustrated in FIGS. 1A and 1B.

Since lower contacts C1 and upper contacts C2 of each of the cell mats M1 are positioned inside the cell mat M1, a distance between adjacent cell mats M1 may be reduced compared to the related art. In the related art, since contacts are disposed outside cell mats, an area accommodating the contacts is disposed between the adjacent cell mats M1.

The cell mats M1 shown in FIGS. 1A to 1C may be vertically stacked multiple times over the substrate 100. Such embodiments will be described below referring to FIGS. 2A to 5.

For convenience of the description, one or more cell mats that are positioned at the same level in a vertical direction will be referred to as a plane. When T number of planes are vertically stacked over a substrate, T being a natural number of 2 or more, the planes will be referred to as first to $T^{th}$ planes depending on the position or distance of the plane from the substrate. That is, the first plane is closest plane to the substrate, and the $T^{th}$ plane is farthest plane from the substrate.

Also, one or more cell mats included in each of the first to $T^{th}$ planes will be referred to as first to $T^{th}$ cell mats. For example, cell mats of a $k^{th}$ plane are referred to as '$k^{th}$' cell mats, k being a natural number in a range of 1 to T. Two planes that are adjacent to each other in the vertical direction may share lines. In an embodiment, upper lines of a $t^{th}$ plane are used as lower lines of a $(t+1)^{th}$ plane, where t is a natural number and ranges from 1 to (T−1).

Figure 2A:
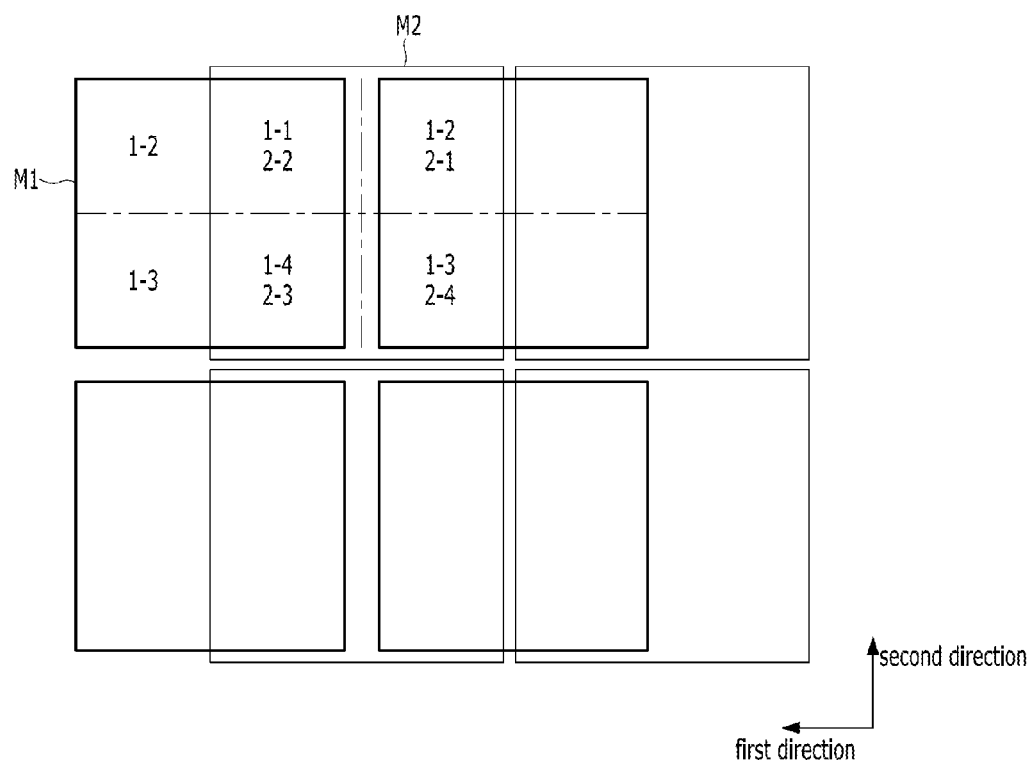
FIGS. 2A to 2C illustrate a semiconductor device including first and second planes in accordance with an embodiment of the present disclosure.
Figure 2B:
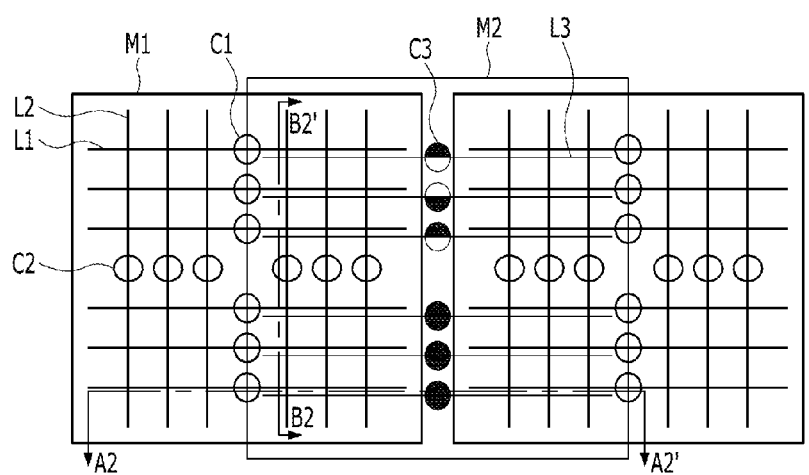
Figure 2C:
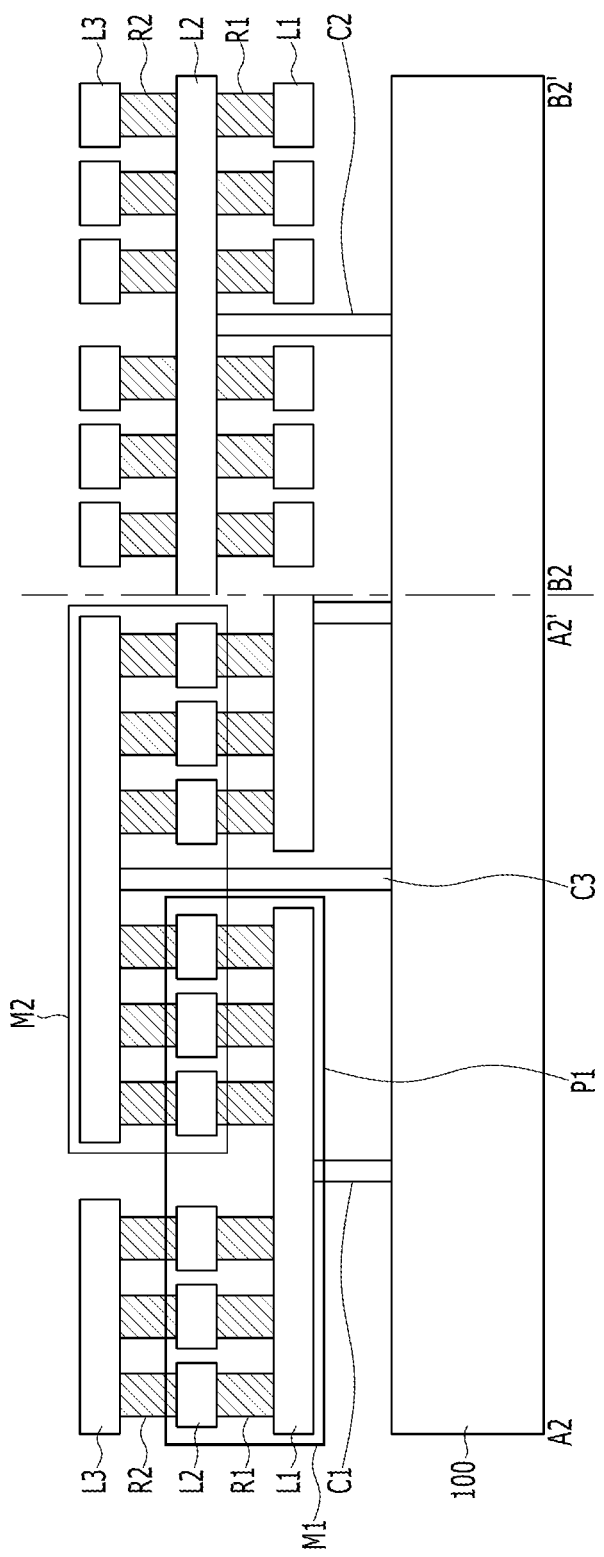

FIGS. 2A to 2C illustrate a semiconductor device including first and second planes in accordance with an embodiment of the present disclosure. FIG. 2A is a plan view illustrating an overlapping relationship between first cell mats M1 of the first plane and second cell mats M2 of the second plane, FIG. 2B is a plan view illustrating a portion of FIG. 2A in more detail, and FIG. 2C is a cross-sectional view taken along lines A2-A2' and B2-B2' of FIG. 2B. For convenience of description, one of the second cell mats M2 is shown in detail in FIG. 2B, but, as shown in FIG. 2A, a plurality of second cell mats M2 may be provided.

Referring to FIGS. 2A to 2C, the first cell mats M1 of the first plane are disposed over a substrate 100, and the second cell mats M2 of the second plane are disposed over the first cell mats M1 of the first plane. The first cell mats M1 and the second cell mats M2 may be arranged in first and second directions and have a matrix form.

Referring to FIG. 2A, in an embodiment, the first cell mats M1 of the first plane partially overlap with the second cell mats M2 of the second plane in a plan view. In an embodiment, as shown in FIG. 2A, one second cell mat M2 is provided to overlap with a first half of one of two adjacent first cell mats M1, which are adjacent to each other in the first direction, and a second half of the other of the two adjacent first cell mats M1. For example, second and third quadrants 2-2 and 2-3 of the second cell mat M2 overlap with first and fourth quadrants 1-1 and 1-4 of one of the two adjacent first cell mats M1, and first and fourth quadrants 2-1 and 2-4 of the second cell mat M2 overlap with second and third quadrants 1-2 and 1-3 of the other of the two adjacent first cell mats M1.

Each of the first cell mats M1 may have substantially the same configuration as the cell mat M1 of FIG. 1A. Therefore, the lower lines L1, the upper lines L2, the lower contacts C1, the upper contacts C2 and the variable resistance elements R1 of FIG. 1B may correspond to first lines L1, second lines L2, first contacts C1, second contacts C2 and first variable resistance elements R1 in FIG. 2C, respectively. The memory cells MC of FIG. 1A may correspond to memory cells (not shown) which are positioned in intersection regions of the first lines L1 and the second lines L2 in FIG. 2C. The memory cells MC positioned in the intersection regions of the first lines L1 and the second lines L2 will be referred to as first memory cells. That is, memory cells in the first cell mat M1 of the first plane are referred to as the first memory cells.

Each of the second cell mats M2 may include second lines L2, which are included in a first half of one of two adjacent first cell mats M1 and a second half of the other of the two adjacent first cell mats M1, a plurality of third lines L3, and second variable resistance elements R2. The third lines L3 are disposed over the second lines L2 and extend in the first direction to cross the second lines L2. The second variable resistance elements R2 are interposed between the second lines L2 and the third lines L3 and positioned at cross points of the second lines L2 and the third lines L3, respectively. The second lines L2 may be shared by the first cell mat M1 and the second cell mat M2, and thus serve as upper lines of the first cell mat M1 and, at the same time, serve as lower lines of the second cell mat M2.

Two first cell mats M1 overlapping with one second cell mat M2 may be adjacent to each other in a direction that crosses second lines L2 shared by the first and second cell mats M1 and M2. Memory cells positioned in intersection regions of the second lines L2 and the third lines L3 will be referred to as second memory cells. That is, memory cells in the second cell mat M2 of the second plane are referred to as the second memory cells.

The second contacts C2 coupled to the second lines L2 of the second cell mat M2 may be positioned at a boundary of the first quadrant 2-1 and the fourth quadrant 2-4 of the second cell mat M2 and at a boundary of the second quadrant 2-2 and the third quadrant 2-3 of the second cell mat M2. That is, in a plan view, each of the second contacts C2 may overlap with a middle portion of a corresponding one of the second lines L2 extending in the second direction so that half of second memory cells in the second cell mat M2 are disposed on one side, e.g., an upper side, of the second contacts C2 and the other half of the second memory cells are disposed on the other side, e.g., a lower side, of the second contacts C2 in the second direction.

The third lines L3 are coupled to the substrate 100 through third contacts C3. The third contacts C3 may be positioned at a boundary of the first quadrant 2-1 and the second quadrant 2-2 of the second cell mat M2 and at a boundary of the third quadrant 2-3 and the fourth quadrant 2-4 of the second cell mat M2, and overlap with middle portions of the third lines L3, respectively. That is, in a plan view, each of the third contacts C3 may overlap with a middle portion of a corresponding one of the third lines L3 extending in the first direction so that half of the second memory cells are disposed on one side of the third contacts C3 and the other half of the second memory cells are disposed on the other side of the third contacts C3 in the first direction. As a result, the third line L3 and the third contact C3 may have a T-shaped cross-section in the first direction. In an embodiment, the third contacts C3 are disposed in a region between the two adjacent first cell mats M1.

In an embodiment including the first and second planes, since each of the first cell mats M1 and the second cell mats M2 includes contacts disposed therein like the cell mat M1 shown in FIGS. 1A and 1B, an improvement in operating characteristics, an increase in a size of a cell mat, and the like may be obtained similarly to the above embodiments described with reference to FIGS. 1A to 1C.

Furthermore, by providing an overlapping relationship between the first cell mats M1 and the second cell mats M2, other advantages may be obtained.

In the related art, cell mats stacked in a vertical direction are formed in the same region. That is, stacked cell mats are vertically aligned with each other so that they completely overlap. Therefore, the arrangement of contacts coupled to the cell mats is complicated, and an area in which the contacts are disposed is required in addition to an area in which the cell mats are disposed. In addition, the distance between cell mats included in one plane increases since contacts are disposed outside the cell mats, e.g., between the cell mats. As a result, the size of the semiconductor device increases.

On the other hand, in an embodiment as shown in FIGS. 2A to 2C, an upper cell mat partially overlaps with a lower cell mat. For example, an upper cell mat overlaps with a first half of one of two adjacent lower cell mats and a second half of the other of the two adjacent lower cell mats and uses upper lines of the two adjacent lower cell mats as lower lines thereof, and contacts coupled to upper lines of the upper cell mat are positioned in a region between the two adjacent lower cell mats. Therefore, it is possible to simplify the arrangement of the contacts and to decrease an area in which the contacts are disposed. As a result, it is possible to simplify the structure of the semiconductor device and decrease the size of the semiconductor device.

Figure 3A:
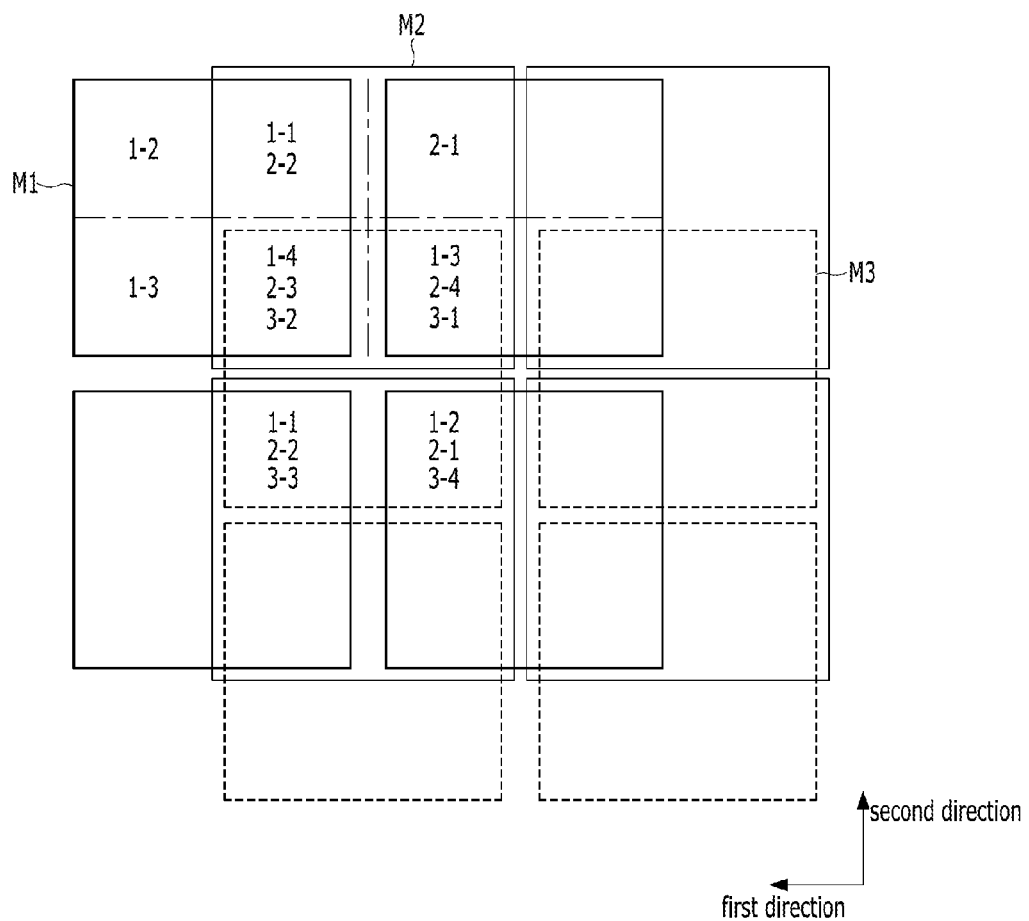
FIGS. 3A to 3C illustrate a semiconductor device including first to third planes in accordance with an embodiment of the present disclosure.
Figure 3B:
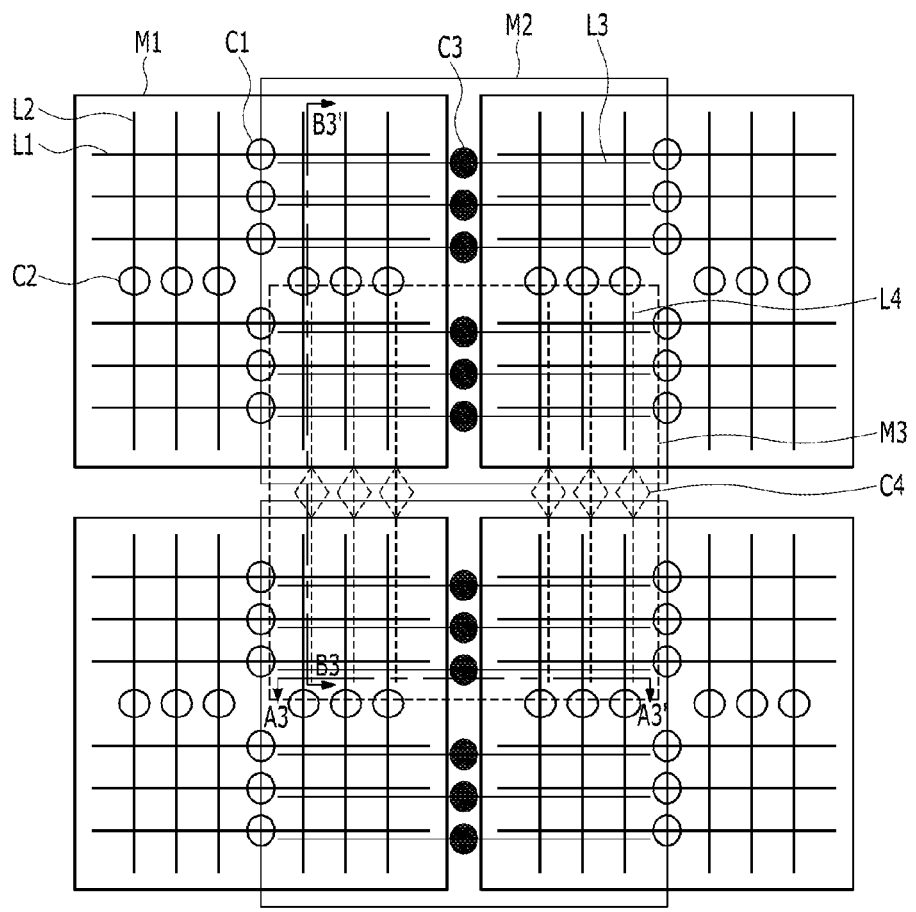
Figure 3C:
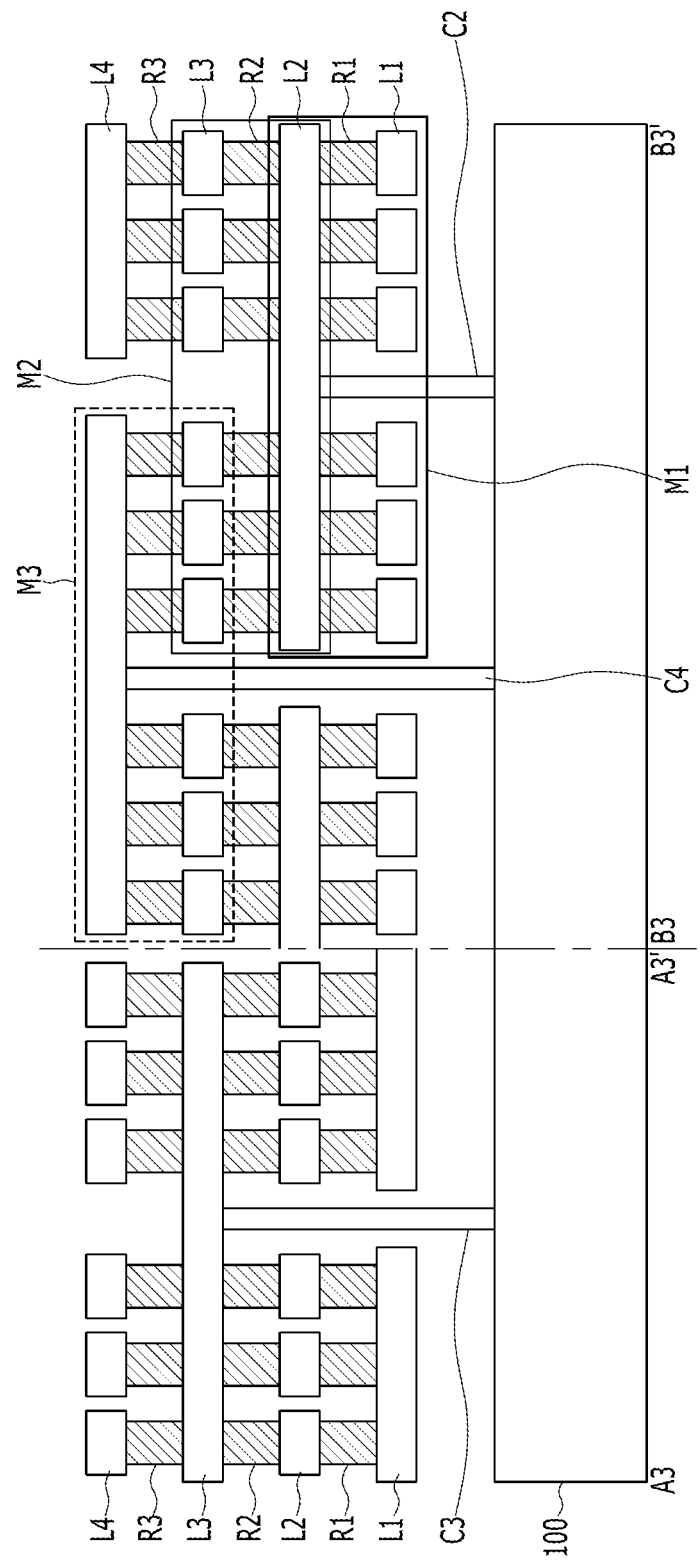

FIGS. 3A to 3C illustrate a semiconductor device including first to third planes in accordance with an embodiment of the present disclosure. FIG. 3A is a plan view illustrating an overlapping relationship between first cell mats M1 of a first plane, second cell mats M2 of a second plane and third cell mats M3 of a third plane. FIG. 3B is a plan view illustrating a portion of FIG. 3A in more detail. FIG. 3C is a cross-sectional view taken along lines A3-A3' and B3-B3' of FIG. 3B.

In an embodiment, the semiconductor device of FIGS. 3A to 3C is substantially the same as a device in which the third cell mats M3 of the third plane are added to the semiconductor device of FIGS. 2A to 2C. For convenience of the description, one of the third cell mats M3 is shown in detail in FIG. 3B, but, as shown in FIG. 3A, a plurality of third cell mats M3 may be provided.

Referring to FIGS. 3A to 3C, the third cell mats M3 of the third plane are disposed over the second cell mats M2 of the second plane. The third cell mats M3 may be arranged in a matrix form along first and second directions.

One third cell mat M3 is provided to partially overlap with second cell mats M2 that are adjacent to each other in the second direction. For example, the third cell mat M3 overlaps with a first half of one of the two adjacent second cell mats M2 and a second half of the other of the two adjacent second cell mats M2. Thus, in an embodiment of the present disclosure, two adjacent second cell mats M2 overlapping with one third cell mats M3 are arranged along the second direction while two adjacent first cell mats M1 overlapping with one second cell mat M2 are arranged along the first direction. As a result, one third cell mat M3 may overlap with four quadrants of four adjacent first cell mats M1 which are adjacent to each other in the first and second directions.

Referring to FIG. 3A, first and second quadrants 3-1 and 3-2 of the third cell mat M3 overlap with fourth and third quadrants 2-4 and 2-3 of one of the two adjacent second cell mats M2, respectively, and third and fourth quadrants 3-3 and 3-4 of the third cell mat M3 overlaps with second and first quadrants 2-2 and 2-1 of the other of the two adjacent second cell mats M2, respectively. Also, the first to fourth quadrants 3-1, 3-2, 3-3 and 3-4 of the third cell mat M3 overlap with a third quadrant 1-3 of a first one of the four adjacent first cell mats M1, a fourth quadrant 1-4 of a second one of the four adjacent first cell mats M1, a first quadrant 1-1 of a third one of the four adjacent first cell mats M1, and a second quadrant 1-2 of a fourth one of the four adjacent first cell mats M1, respectively.

Referring to FIGS. 3B and 3C, each of the third cell mats M3 includes third lines L3, which are included in a first half of one of the two adjacent second cell mats M2 and a second half of the other of the two adjacent second cell mats M2, a plurality of fourth lines L4, and third variable resistance elements R3. The fourth lines L4 are disposed over the third lines L3 and extend in the second direction to cross the third lines L3. The third variable resistance elements R3 are interposed between the third lines L3 and the fourth lines L4 and positioned in intersection regions of the third lines L3 and the fourth lines L4, respectively. The third lines L3 are shared by the second cell mat M2 and the third cell mat M3, and serve as upper lines of the second cell mat M2 and, at the same time, serve as lower lines of the third cell mat M3. Memory cells positioned in the intersection regions of the third lines L3 and the fourth lines L4 will be referred to as third memory cells.

That is, memory cells in the third cell mat M3 of the third plane are referred to as the third memory cells.

The fourth lines L4 are coupled to the substrate 100 through fourth contacts C4. The fourth contacts C4 may be positioned at a boundary of the first quadrant 3-1 and the fourth quadrant 3-4 of the third cell mat M3 and at a boundary of the second quadrant 3-2 and the third quadrant 3-3 of the third cell mat M3, and overlap with the fourth lines L4, respectively. In an embodiment, each of the fourth contacts C4 overlaps with a middle portion of a corresponding one of the fourth lines L4 extending in the second direction so that half of the third memory cells included in the third cell mat M3 are disposed on one side of the fourth contacts C4 and the other half of the third memory cells are disposed on the other side of the fourth contacts C4 in the second direction. As a result, as shown in FIG. 3C, the fourth line L4 and the fourth contact C4 may form a T-shape in a cross-section in the second direction (e.g., along the line B3-B3').

In accordance with the present embodiment, a degree of integration of a semiconductor device may be further increased by using a three-layered stacked structure as well as obtaining the above advantages described with reference to FIGS. 1A to 2C.

Figure 4A:
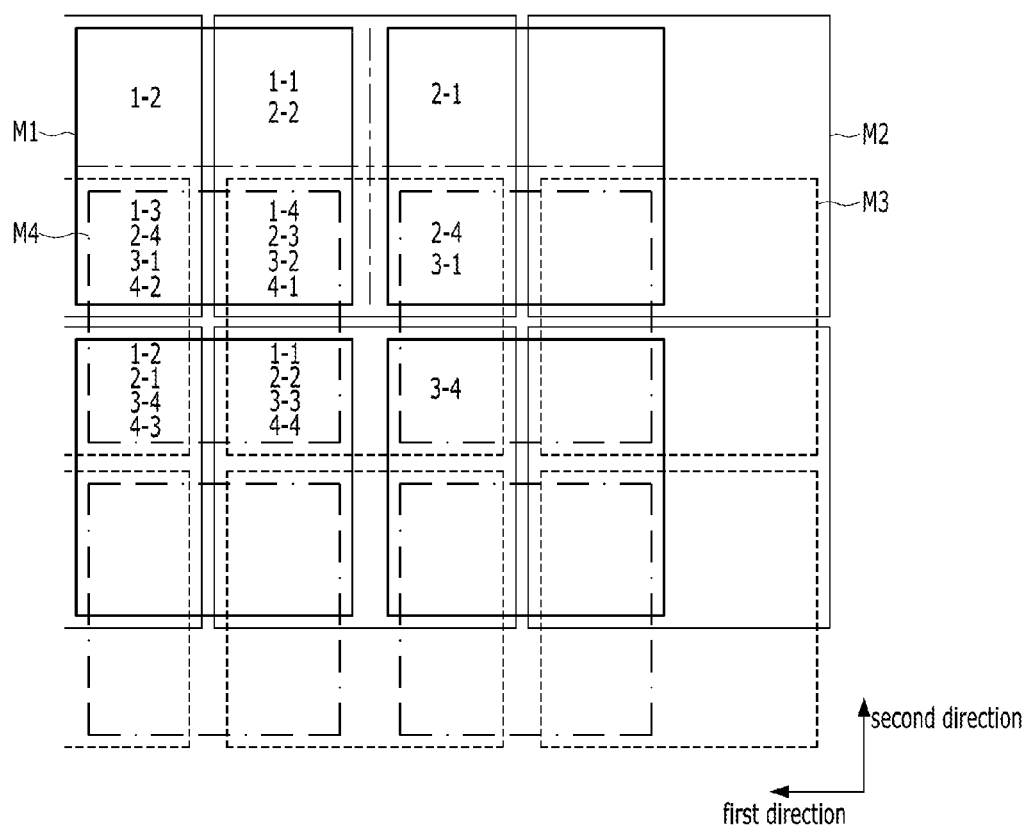
FIGS. 4A to 4C illustrate a semiconductor device including first to fourth planes in accordance with an embodiment of the present disclosure.
Figure 4B:
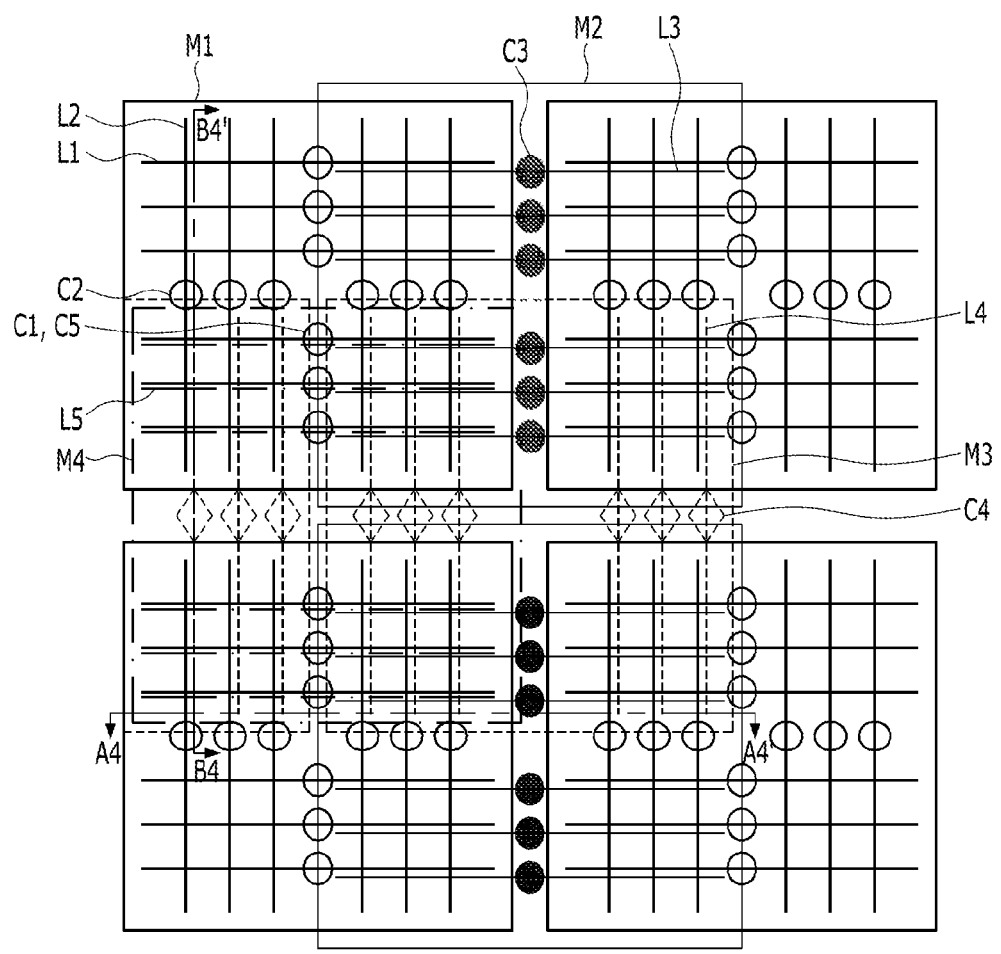
Figure 4C:
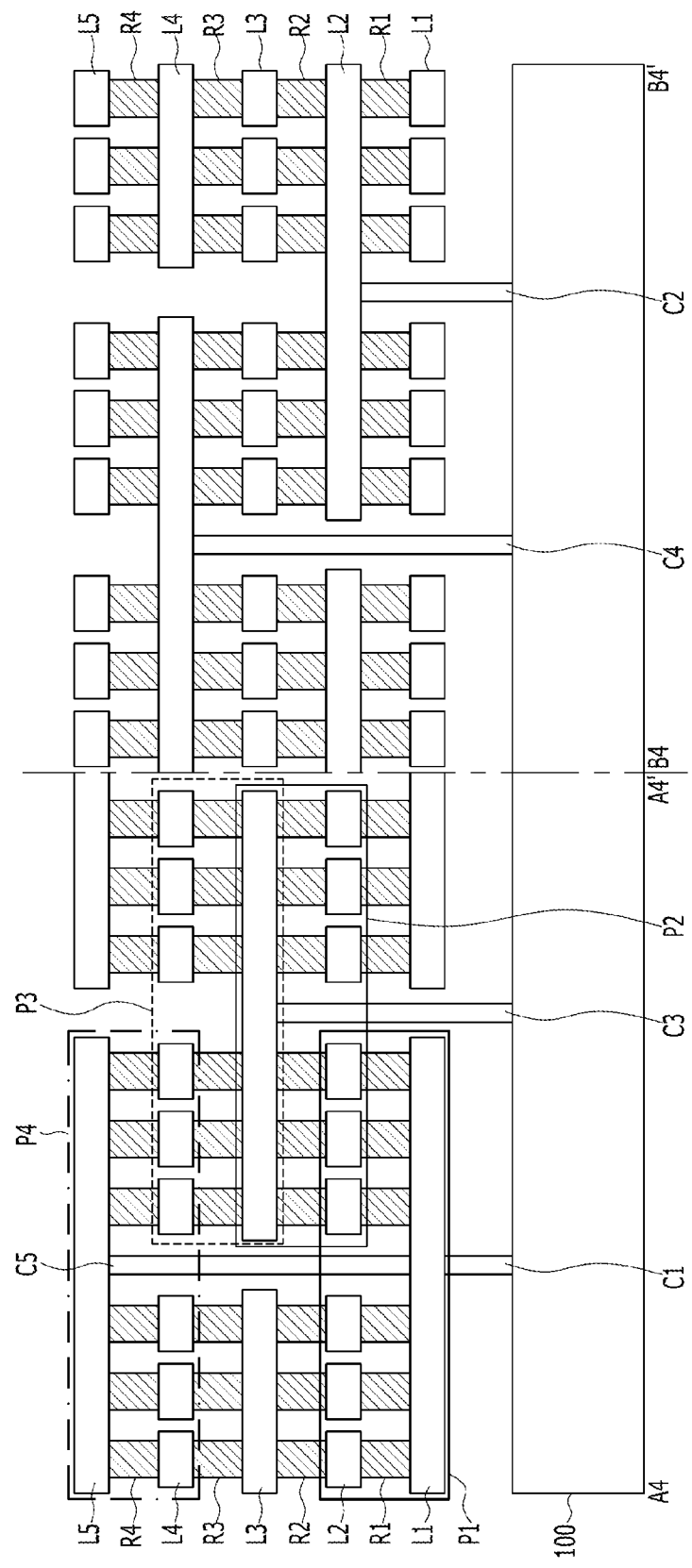

FIGS. 4A to 4C illustrate a semiconductor device including first to fourth planes in accordance with an embodiment of the present disclosure. FIG. 4A is a plan view illustrating an overlapping relationship between first cell mats M1 of a first plane, second cell mats M2 of a second plane, third cell mats M3 of a third plane and fourth cell mats M4 of a fourth plane. FIG. 4B is a plan view illustrating a portion of FIG. 4A in more detail. FIG. 4C is a cross-sectional view taken along lines A4-A4' and B4-B4' of FIG. 4B.

In an embodiment, the semiconductor device of FIGS. 4A to 4C is substantially the same as a device in which the fourth cell mats M4 of the fourth plane are added to the semiconductor device of FIGS. 3A to 3C. For convenience of the description, one of the fourth cell mats M4 is shown in detail in FIG. 4B, but, as shown in FIG. 4A, a plurality of fourth cell mats M4 may be provided.

Referring to FIGS. 4A to 4C, the fourth cell mats M4 of the fourth plane are disposed over the third cell mats M3 of the third plane. The fourth cell mats M4 may be arranged in a matrix form along first and second directions.

One fourth cell mat M4 is provided to partially overlap two third cell mats that are adjacent to each other in the first direction. For example, the fourth cell mat M4 overlaps with a first half of one of the two adjacent third cell mats M3 and a second half of the other of the two adjacent third cell mats M3. In addition, one fourth cell mat M4 overlaps with one quadrant of each of four second cell mats M2 that are adjacent to each other in the first and second directions. Also, the fourth cell mat M4 overlaps with a first half of one of two first cell mats M1 that are adjacent in the second direction and a second half of the other of the two adjacent first cell mats M1.

Referring to FIGS. 4B and 4C, each of the fourth cell mats M4 includes fourth lines L4, which are included in the first half of one of the two adjacent third cell mats M3 and the second half of the other of the two adjacent third cell mats M3, a plurality of fifth lines L5, and fourth variable resistance elements R4. The fifth lines L5 are disposed over the fourth lines L4 and extend in the first direction to cross the fourth lines L4. The fourth variable resistance elements R4 are interposed between the fourth lines L4 and the fifth lines L5 and positioned in intersection regions of the fourth lines L4 and the fifth lines L5, respectively. The fourth lines L4 are shared by the third cell mat M3 and the fourth cell mat M4. Memory cells positioned in the intersection regions of the fourth lines L4 and the fifth lines L5 will be referred to as fourth memory cells. That is, memory cells in the fourth cell mat M4 of the fourth plane are referred to as the fourth memory cells.

The fifth lines L5 are coupled to the substrate 100 through fifth contacts C5. The fifth contacts C5 may be positioned at a boundary of a first quadrant 4-1 and a second quadrant 4-2 of the fourth cell mat M4 and at a boundary of a third quadrant 4-3 and a fourth quadrant 4-4 of the fourth cell mat M4, and overlap with middle portions of the fifth lines L5 extending in the first direction, respectively. Also, the fifth contacts C5 may overlap with first contacts C1. In an embodiment, the fifth contacts C5 may be coupled to the first lines L1 and the first contacts C1, and thus the first lines L1 and the fifth lines L5 may be controlled together by a certain element (not shown) formed in and/or on the substrate 100. Although the first lines L1 and the fifth lines L5 are controlled together, the second lines L2 and the fourth lines L4 may be controlled separately. As a result, the first memory cells of the first cell mat M1 coupled to the first and second lines L1 and L2 may operate independent of the fourth memory cells of the fourth cell mat M4 coupled to the fourth and fifth lines L4 and L5.

In the present embodiment, a degree of integration of a semiconductor device may be further increased by using a four-layered stacked structure as well as obtaining the above advantages described with reference to FIGS. 1A to 2C.

Referring to the above described multi-layered stacked structures, following rules may be derived.

In accordance with an embodiment, one plane, for example a $t^{th}$ plane, includes one or more $t^{th}$ cell mats and each of the $t^{th}$ cell mats includes $t^{th}$ lower lines extending in a first direction and $t^{th}$ upper lines disposed over the $t^{th}$ lower lines and extending in a second direction crossing the first direction. Each of one or more $(t+1)^{th}$ cell mats included in a $(t+1)^{th}$ plane shares the $t^{th}$ upper lines with the $t^{th}$ plane and overlaps with a first half of one of two $t^{th}$ cell mats that are adjacent to each other in the first direction and a second half of the other of the two adjacent $t^{th}$ cell mats, wherein the second half is adjacent to the first half in the first direction, t being a natural number. Each of the $(t+1)^{th}$ cell mats uses $t^{th}$ upper lines included in the first half and $t^{th}$ upper lines included in the second half of the two adjacent $t^{th}$ cell mats as lower lines. That is, the $t^{th}$ upper lines included in the first half and the $t^{th}$ upper lines included in the second half of the two adjacent $t^{th}$ cell mats may correspond to $(t+1)^{th}$ lower lines of the $(t+1)^{th}$ cell mat. Each of the $(t+1)^{th}$ cell mats further includes $(t+1)^{th}$ upper lines, which are disposed over the $(t+1)^{th}$ lower lines and extend in a direction crossing the $(t+1)^{th}$ lower lines. It would be apparent to one skilled in the art that variable resistance elements are interposed between upper lines and lower lines so that the variable resistance elements are positioned at cross points of the upper lines and the lower lines, respectively.

A $t^{th}$ lower contact coupled to each of the $t^{th}$ lower lines is positioned at a middle portion of each of the $t^{th}$ lower lines. A $t^{th}$ upper contact (or a $(t+1)^{th}$ lower contact) coupled to each of the $t^{th}$ upper lines (or $(t+1)^{th}$ lower lines) is positioned at a middle portion of each of the $t^{th}$ upper lines. A $(t+1)^{th}$ upper contact coupled to each of the $(t+1)^{th}$ upper lines is positioned at a middle portion of each of the $(t+1)^{th}$ upper lines. Therefore, the $(t+1)^{th}$ upper contact is positioned in a region between two adjacent $t^{th}$ cell mats.

FIG. 5 illustrates a semiconductor device including 5 or more planes in accordance with an embodiment of the present disclosure.

Referring to FIG. 5, fifth cell mats M5 of a fifth plane are aligned with first cell mats M1 of a first plane, respectively. Sixth cell mats M6 of a sixth plane are aligned with second cell mats M2 of a second plane, respectively. Seventh cell mats M7 of a seventh plane are aligned with third cell mats M3 of a third plane, respectively. Eighth cell mats M8 of an eighth plane are aligned with fourth cell mats M4 of a fourth plane, respectively. That is, the overlapping relationship of the first to fourth cell mats is repeated in a vertical direction as the number of planes increases.

As a result, $(4n+1)^{th}$ cell mats $M_{4n+1}$ of a $(4n+1)^{th}$ plane are aligned with the first cell mats M1 where n is a natural number. $(4n+2)^{th}$ cell mats $M_{4n+2}$ of $(4n+2)^{th}$ planes are aligned with the second cell mats M2. $(4n+3)^{th}$ cell mats $M_{4n+3}$ of $4n+3^{th}$ planes are aligned with the third cell mats M3. $(4n+4)^{th}$ cell mats $M_{4n+4}$ of $4n+4^{th}$ planes are aligned with the fourth cell mats M4.

Positions of lines, variable resistance elements and contacts of the $(4n+1)^{th}$ cell mats $M_{4n+1}$ may be substantially the same as those of the first cell mats M1. That is, the lines, the variable resistance elements and the contacts of the $(4n+1)^{th}$ cell mats $M_{4n+1}$ may overlap with the first and second lines L1 and L2, the first variable resistance elements R1 and the first and second contacts C1 and C2, in a plan view. Similarly, positions of lines, variable resistance elements and contacts of the $(4n+2)^{th}$ cell mats $M_{4n+2}$, the $(4n+3)^{th}$ cell mats $M_{4n+3}$, and the $(4n+4)^{th}$ cell mats $M_{4n+4}$ may be substantially the same as those of the second cell mats M2, the third cell mats M3 and the fourth cell mats M4, respectively.

The above and other memory circuits or semiconductor devices based on the disclosed technology can be used in a range of devices or systems. FIGS. 6-10 provide some examples of devices or systems that can implement a memory circuit in accordance with an embodiment disclosed herein.

Figure 6:
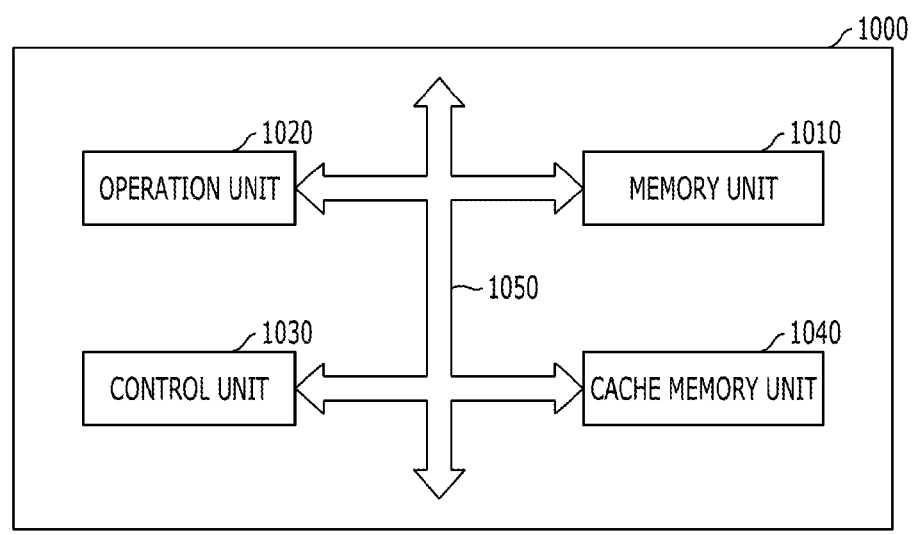
FIG. 6 illustrates a microprocessor implementing memory circuitry based on the disclosed technology.

FIG. 6 illustrates a microprocessor implementing memory circuitry based on the disclosed technology.

Referring to FIG. 6, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with embodiments. For example, the memory unit 1010 may include first to $T^{th}$ planes (T is a natural number of 2 or more) which are sequentially stacked over a substrate, each of the first to $T^{th}$ planes including one or more cell mats, wherein a $t^{th}$ cell mat of a $t^{th}$ plane (t is a natural number and ranges from 1 to T) includes $t^{th}$ lower lines extending in a first direction, $t^{th}$ upper lines disposed over the $t^{th}$ lower lines and extending in a second direction crossing the first direction, and $t^{th}$ variable resistance elements positioned at cross points between the $t^{th}$ lower lines and the $t^{th}$ upper lines, a $t+1^{th}$ cell mat of a $t+1^{th}$ plane overlaps with a first half of one of two adjacent $t^{th}$ cell mats which are adjacent to each other in the first direction and a second half of the other of the two adjacent $t^{th}$ cell mats where the second half is adjacent to the first half in the first direction, and includes the $t^{th}$ upper lines disposed in the first half and the second half, $t+1^{th}$ upper lines disposed over the $t^{th}$ upper lines and extending in the first direction, and $t+1^{th}$ variable resistance elements positioned at cross points between the $t^{th}$ upper lines and the $t+1^{th}$ upper lines, and a $t^{th}$ lower contact coupled to each of the $t^{th}$ lower lines, a $t^{th}$ upper contact coupled to each of the $t^{th}$ upper lines, and a $t+1^{th}$ upper contact coupled to each of the $t+1^{th}$ upper lines overlap with a middle of each of the $t^{th}$ lower lines, a middle of each of the $t^{th}$ upper lines, and a middle of each of the $t+1^{th}$ upper lines, respectively. Through this, an integration degree of the memory unit 1010 may be increased and performance characteristics of the memory unit 1010 may be improved. As a consequence, a size of the microprocessor 1000 may be reduced and performance characteristics of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to this embodiment may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 7:
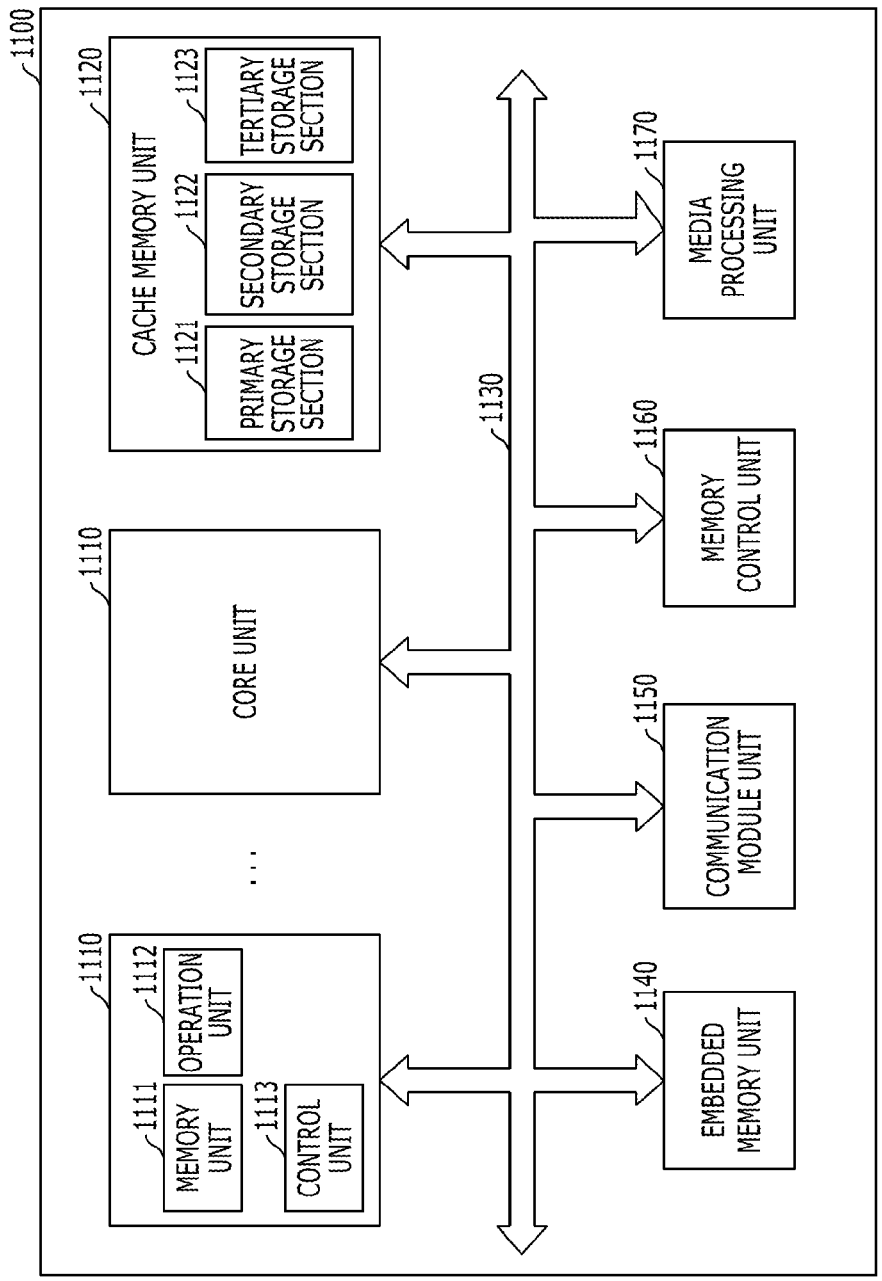
FIG. 7 illustrates a processor implementing memory circuitry based on the disclosed technology.

FIG. 7 illustrates a processor implementing memory circuitry based on the disclosed technology.

Referring to FIG. 7, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of this embodiment is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The data processing speeds at which the primary, secondary and tertiary storage sections 1121, 1122 and 1123 store and discriminate data may be the same or different. In the case where the data processing speeds of the respective storage sections 1121, 1122 and 1123 are different, the data processing speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the embodiments. For example, the cache memory unit 1120 may include first to $T^{th}$ planes (T is a natural number of 2 or more) which are sequentially stacked over a substrate, each of the first to $T^{th}$ planes including one or more cell mats, wherein a $t^{th}$ cell mat of a $t^{th}$ plane (t is a natural number and ranges from 1 to T) includes $t^{th}$ lower lines extending in a first direction, $t^{th}$ upper lines disposed over the $t^{th}$ lower lines and extending in a second direction crossing the first direction, and $t^{th}$ variable resistance elements positioned at cross points between the $t^{th}$ lower lines and the $t^{th}$ upper lines, a $t+1^{th}$ cell mat of a $t+1^{th}$ plane overlaps with a first half of one of two adjacent $t^{th}$ cell mats which are adjacent to each other in the first direction and a second half of the other of the two adjacent $t^{th}$ cell mats where the second half is adjacent to the first half in the first direction, and includes the $t^{th}$ upper lines disposed in the first half and the second half, $t+1^{th}$ upper lines disposed over the $t^{th}$ upper lines and extending in the first direction, and $t+a^{th}$ variable resistance elements positioned at cross points between the $t^{th}$ upper lines and the $t+1^{th}$ upper lines, and a $t^{th}$ lower contact coupled to each of the $t^{th}$ lower lines, a $t^{th}$ upper contact coupled to each of the $t^{th}$ upper lines, and a $t+1^{th}$ upper contact coupled to each of the $t+1^{th}$ upper lines overlap with a middle of each of the $t^{th}$ lower lines, a middle of each of the $t^{th}$ upper lines, and a middle of each of the $t+1^{th}$ upper lines, respectively. Through this, an integration degree of the cache memory unit 1120 may be increased and performance characteristics of the cache memory unit 1120 may be improved. As a consequence, a size of the processor 1100 may be reduced and performance characteristics of the processor 1100 may be improved.

Although it was shown in FIG. 7 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another embodiment, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to this embodiment may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The data processing speed of the primary storage section 1121 may be faster than the data processing speeds of the secondary and tertiary storage section 1122 and 1123. In another embodiment, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to this embodiment may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 8:
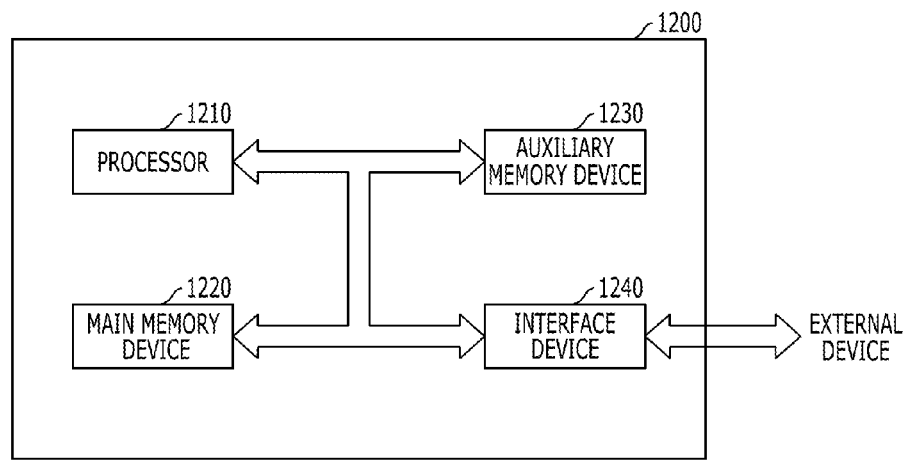
FIG. 8 illustrates a system implementing memory circuitry based on the disclosed technology.

FIG. 8 illustrates a system implementing memory circuitry based on the disclosed technology.

Referring to FIG. 8, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of this embodiment may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the embodiments. For example, the main memory device 1220 may include first to $T^{th}$ planes (T is a natural number of 2 or more) which are sequentially stacked over a substrate, each of the first to $T^{th}$ planes including one or more cell mats, wherein a $t^{th}$ cell mat of a $t^{th}$ plane (t is a natural number and ranges from 1 to T) includes $t^{th}$ lower lines extending in a first direction, $t^{th}$ upper lines disposed over the $t^{th}$ lower lines and extending in a second direction crossing the first direction, and $t^{th}$ variable resistance elements positioned at cross points between the $t^{th}$ lower lines and the $t^{th}$ upper lines, a $t+1^{th}$ cell mat of a $t+1^{th}$ plane overlaps with a first half of one of two adjacent $t^{th}$ cell mats which are adjacent to each other in the first direction and a second half of the other of the two adjacent $t^{th}$ cell mats where the second half is adjacent to the first half in the first direction, and includes the $t^{th}$ upper lines disposed in the first half and the second half, $t+1^{th}$ upper lines disposed over the $t^{th}$ upper lines and extending in the first direction, and $t+1^{th}$ variable resistance elements positioned at cross points between the $t^{th}$ upper lines and the $t+1^{th}$ upper lines, and a $t^{th}$ lower contact coupled to each of the $t^{th}$ lower lines, a $t^{th}$ upper contact coupled to each of the $t^{th}$ upper lines, and a $t+1^{th}$ upper contact coupled to each of the $t+1^{th}$ upper lines overlap with a middle of each of the $t^{th}$ lower lines, a middle of each of the $t^{th}$ upper lines, and a middle of each of the $t+1^{th}$ upper lines, respectively. Through this, an integration degree of the main memory device 1220 may be increased and performance characteristics of the main memory device 1220 may be improved. As a consequence, a size of the system 1200 may be reduced and performance characteristics of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the embodiments, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include first to $T^{th}$ planes (T is a natural number of 2 or more) which are sequentially stacked over a substrate, each of the first to $T^{th}$ planes including one or more cell mats, wherein a $t^{th}$ cell mat of a $t^{th}$ plane (t is a natural number and ranges from 1 to T) includes $t^{th}$ lower lines extending in a first direction, $t^{th}$ upper lines disposed over the $t^{th}$ lower lines and extending in a second direction crossing the first direction, and $t^{th}$ variable resistance elements positioned at cross points between the $t^{th}$ lower lines and the $t^{th}$ upper lines, a $t+1^{th}$ cell mat of a $t+1^{th}$ plane overlaps with a first half of one of two adjacent $t^{th}$ cell mats which are adjacent to each other in the first direction and a second half of the other of the two adjacent $t^{th}$ cell mats where the second half is adjacent to the first half in the first direction, and includes the $t^{th}$ upper lines disposed in the first half and the second half, $t+1^{th}$ upper lines disposed over the $t^{th}$ upper lines and extending in the first direction, and $t+1^{th}$ variable resistance elements positioned at cross points between the $t^{th}$ upper lines and the $t+1^{th}$ upper lines, and a $t^{th}$ lower contact coupled to each of the $t^{th}$ lower lines, a $t^{th}$ upper contact coupled to each of the $t^{th}$ upper lines, and a $t+1^{th}$ upper contact coupled to each of the $t+1^{th}$ upper lines overlap with a middle of each of the $t^{th}$ lower lines, a middle of each of the $t^{th}$ upper lines, and a middle of each of the $t+1^{th}$ upper lines, respectively. Through this, an integration degree of the auxiliary memory device 1230 may be increased and performance characteristics of the auxiliary memory device 1230 may be improved. As a consequence, a size of the system 1200 may be reduced and performance characteristics of the system 1200 may be improved.

Also, the auxiliary memory device 1230 may further include a data storage system (see the data storage system 1300 of FIG. 9) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the embodiments, but may include data storage systems (see the data storage system 1300 of FIG. 9) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of this embodiment and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 9:
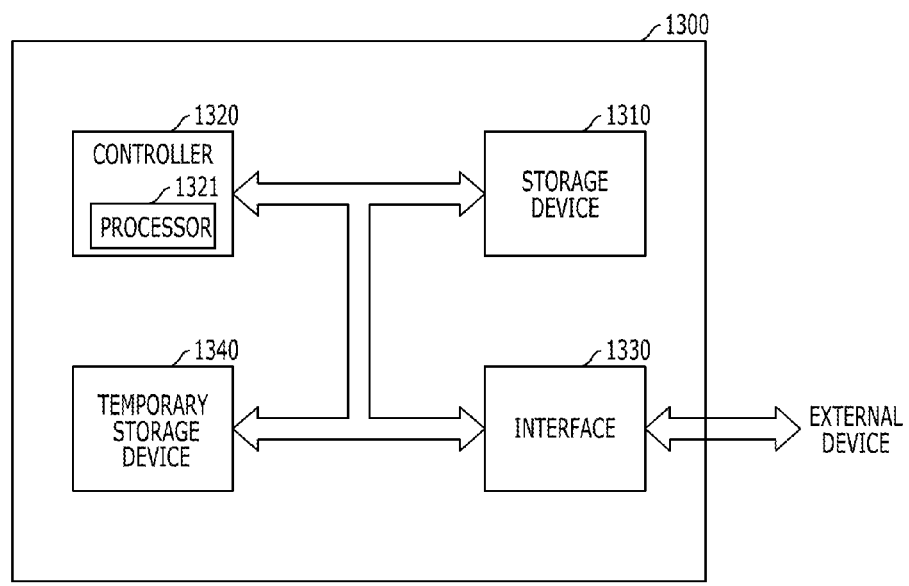
FIG. 9 illustrates a data storage system implementing memory circuitry based on the disclosed technology.

FIG. 9 illustrates a data storage system implementing memory circuitry based on the disclosed technology.

Referring to FIG. 9, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for processing commands inputted through the interface 1330 from an external device.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the embodiments. The temporary storage device 1340 may include first to $T^{th}$ planes (T is a natural number of 2 or more) which are sequentially stacked over a substrate, each of the first to $T^{th}$ planes including one or more cell mats, wherein a $t^{th}$ cell mat of a $t^{th}$ plane (t is a natural number and ranges from 1 to T) includes $t^{th}$ lower lines extending in a first direction, $t^{th}$ upper lines disposed over the $t^{th}$ lower lines and extending in a second direction crossing the first direction, and $t^{th}$ variable resistance elements positioned at cross points between the $t^{th}$ lower lines and the $t^{th}$ upper lines, a $t+1^{th}$ cell mat of a $t+1^{th}$ plane overlaps with a first half of one of two adjacent $t^{th}$ cell mats which are adjacent to each other in the first direction and a second half of the other of the two adjacent $t^{th}$ cell mats where the second half is adjacent to the first half in the first direction, and includes the $t^{th}$ upper lines disposed in the first half and the second half, t+1$^{th}$ upper lines disposed over the t$^{th}$ upper lines and extending in the first direction, and t+1$^{th}$ variable resistance elements positioned at cross points between the t$^{th}$ upper lines and the t+1$^{th}$ upper lines, and a t$^{th}$ lower contact coupled to each of the t$^{th}$ lower lines, a t$^{th}$ upper contact coupled to each of the t$^{th}$ upper lines, and a t+1$^{th}$ upper contact coupled to each of the t+1$^{th}$ upper lines overlap with a middle of each of the t$^{th}$ lower lines, a middle of each of the t$^{th}$ upper lines, and a middle of each of the t+1$^{th}$ upper lines, respectively. Through this, an integration degree of the temporary storage device 1340 may be increased and performance characteristics of the temporary storage device 1340 may be improved. As a consequence, a size of the data storage system 1300 may be reduced and performance characteristics of the data storage system 1300 may be improved.

Figure 10:
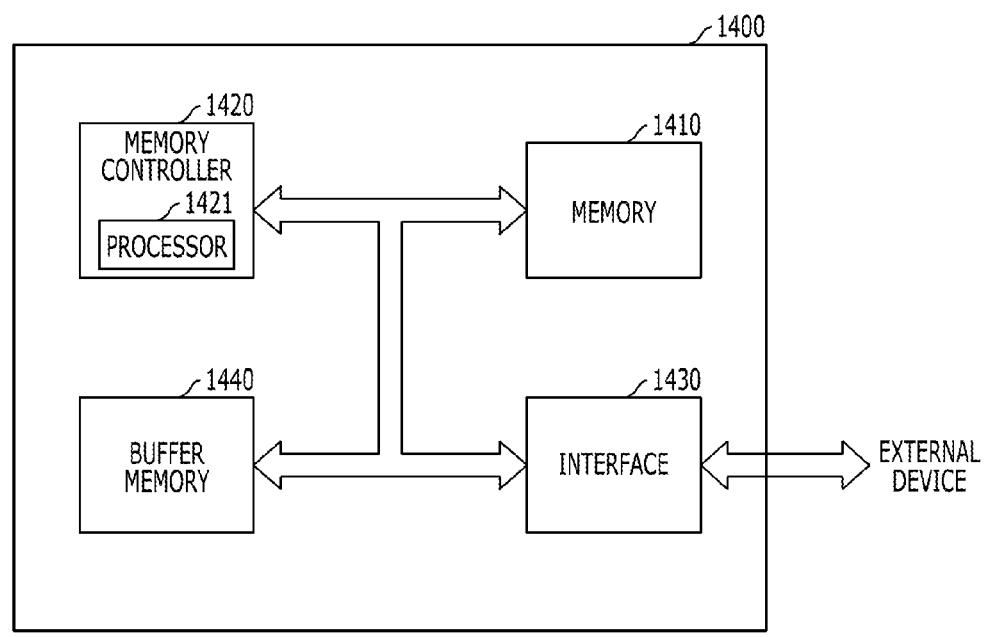
FIG. 10 illustrates a memory system implementing memory circuitry based on the disclosed technology.

FIG. 10 illustrates a memory system implementing memory circuitry based on the disclosed technology.

Referring to FIG. 10, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the embodiments. For example, the memory 1410 may include first to T$^{th}$ planes (T is a natural number of 2 or more) which are sequentially stacked over a substrate, each of the first to T$^{th}$ planes including one or more cell mats, wherein a t$^{th}$ cell mat of a t$^{th}$ plane (t is a natural number and ranges from 1 to T) includes t$^{th}$ lower lines extending in a first direction, t$^{th}$ upper lines disposed over the t$^{th}$ lower lines and extending in a second direction crossing the first direction, and t$^{th}$ variable resistance elements positioned at cross points between the t$^{th}$ lower lines and the t$^{th}$ upper lines, a t+1$^{th}$ cell mat of a t+1$^{th}$ plane overlaps with a first half of one of two adjacent t$^{th}$ cell mats which are adjacent to each other in the first direction and a second half of the other of the two adjacent t$^{th}$ cell mats where the second half is adjacent to the first half in the first direction, and includes the t$^{th}$ upper lines disposed in the first half and the second half, t+1$^{th}$ upper lines disposed over the t$^{th}$ upper lines and extending in the first direction, and t+1$^{th}$ variable resistance elements positioned at cross points between the t$^{th}$ upper lines and the t+1$^{th}$ upper lines, and a t$^{th}$ lower contact coupled to each of the t$^{th}$ lower lines, a t$^{th}$ upper contact coupled to each of the t$^{th}$ upper lines, and a t+1$^{th}$ upper contact coupled to each of the t+1$^{th}$ upper lines overlap with a middle of each of the t$^{th}$ lower lines, a middle of each of the t$^{th}$ upper lines, and a middle of each of the t+1$^{th}$ upper lines, respectively. Through this, an integration degree of the memory 1410 may be increased and performance characteristics of the memory 1410 may be improved. As a consequence, a size of the memory system 1400 may be reduced and performance characteristics of the memory system 1400 may be improved.

Also, the memory 1410 according to this embodiment may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an external device.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to this embodiment may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the embodiments. The buffer memory 1440 may include first to T$^{th}$ planes (T is a natural number of 2 or more) which are sequentially stacked over a substrate, each of the first to T$^{th}$ planes including one or more cell mats, wherein a t$^{th}$ cell mat of a t$^{th}$ plane (t is a natural number and ranges from 1 to T) includes t$^{th}$ lower lines extending in a first direction, t$^{th}$ upper lines disposed over the t$^{th}$ lower lines and extending in a second direction crossing the first direction, and t$^{th}$ variable resistance elements positioned at cross points between the t$^{th}$ lower lines and the t$^{th}$ upper lines, a t+1$^{th}$ cell mat of a t+1$^{th}$ plane overlaps with a first half of one of two adjacent t$^{th}$ cell mats which are adjacent to each other in the first direction and a second half of the other of the two adjacent t$^{th}$ cell mats where the second half is adjacent to the first half in the first direction, and includes the t$^{th}$ upper lines disposed in the first half and the second half, t+1$^{th}$ upper lines disposed over the t$^{th}$ upper lines and extending in the first direction, and t+1$^{th}$ variable resistance elements positioned at cross points between the t$^{th}$ upper lines and the t+1$^{th}$ upper lines, and a t$^{th}$ lower contact coupled to each of the t$^{th}$ lower lines, a t$^{th}$ upper contact coupled to each of the t$^{th}$ upper lines, and a t+1$^{th}$ upper contact coupled to each of the t+1$^{th}$ upper lines overlap with a middle of each of the t$^{th}$ lower lines, a middle of each of the t$^{th}$ upper lines, and a middle of each of the t+1$^{th}$ upper lines, respectively. Through this, an integration degree of the buffer memory 1440 may be increased and performance characteristics of the buffer memory 1440 may be improved. As a consequence, a size of the memory system 1400 may be reduced and performance characteristics of the memory system 1400 may be improved.

Moreover, the buffer memory 1440 according to this embodiment may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the embodiments, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 6-10 based on a memory device in accordance with an embodiment disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this present document contains many specifics, these should not be construed as limitations on the scope of any invention or of what may be claimed, but rather as descriptions of features that may be specific to particular embodiments of particular inventions. Certain features that are described in the present disclosure in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve described results. Moreover, the separation of various system components in the embodiments described in this patent document should not be understood as requiring such separation in all embodiments.

Only a few embodiments and examples are described. Other embodiments, enhancements and variations can be made based on what is described and illustrated in this disclosure.

What is claimed is:

1. An electronic device comprising a semiconductor memory unit, the semiconductor memory unit comprising:
first to $T^{th}$ planes vertically stacked over a substrate, each of the first to $T^{th}$ planes including one or more cell mats that are horizontally arranged in each plane, T being a natural number greater than or equal to 2,
wherein each of $t^{th}$ cell mats of a $t^{th}$ plane includes $t^{th}$ lower lines extending in a first direction, $t^{th}$ upper lines disposed over the $t^{th}$ lower lines and extending in a second direction crossing the first direction, and $t^{th}$ variable resistance elements disposed between the $t^{th}$ lower lines and the $t^{th}$ upper lines and disposed in intersection regions of the $t^{th}$ lower lines and the $t^{th}$ upper lines, respectively, t being a natural number in a range of 1 to T, and
wherein each of $(t+1)^{th}$ cell mats of a $(t+1)^{th}$ plane overlaps with a first half of one of two $t^{th}$ cell mats that are adjacent to each other in the first direction and overlaps with a second half of the other of the two adjacent $t^{th}$ cell mats, the second half of the other of the two adjacent $t^{th}$ cell mats being adjacent to the first half of one of the two $t^{th}$ cell mats in the first direction, and said each of the $(t+1)^{th}$ cell mats including $t^{th}$ upper lines disposed in the first half of one of the two $t^{th}$ cell mats and the second half of the other of the two adjacent $t^{th}$ cell mats as $(t+1)^{th}$ lower lines, $(t+1)^{th}$ upper lines disposed over the $(t+1)^{th}$ lower lines and extending in the first direction, and $(t+1)^{th}$ variable resistance elements disposed between the $t^{th}$ upper lines and the $(t+1)^{th}$ upper lines and disposed in intersection regions of the $t^{th}$ upper lines and the $(t+1)^{th}$ upper lines;
a $t^{th}$ lower contact coupled to a corresponding one of the $t^{th}$ lower lines and overlapping with a middle portion of the corresponding one of the $T^{th}$ lower lines;
a $t^{th}$ upper contact coupled to a corresponding one of the $t^{th}$ upper lines and overlapping with a middle portion of the corresponding one of the $t^{th}$ upper lines; and
a $(t+1)^{th}$ upper contact coupled to a corresponding one of the $(t+1)^{th}$ upper lines and overlapping with a middle portion of the corresponding one of the $(t+1)^{th}$ upper lines,
wherein a number of the $t^{th}$ variable resistance elements disposed on one side of the $t^{th}$ lower contact is the same as a number of the $t^{th}$ variable resistance elements disposed on the other side of the $t^{th}$ lower contact,
wherein a number of the $t^{th}$ variable resistance elements disposed on one side of the $t^{th}$ upper contact is the same as a number of the $t^{th}$ variable resistance elements disposed on the other side of the $t^{th}$ upper contact,
wherein a number of the $(t+1)^{th}$ variable resistance elements disposed on one side of the $t^{th}$ upper contact is the same as a number of the $(t+1)^{th}$ variable resistance elements disposed on the other side of the $t^{th}$ upper contact, and
wherein a number of the $(t+1)^{th}$ variable resistance elements disposed on one side of the $(t+1)^{th}$ upper contact is the same as a number of the $(t+1)^{th}$ variable resistance elements disposed on the other side of the $(t+1)^{th}$ upper contact.

2. The electronic device according to claim 1, wherein the $(t+1)^{th}$ upper contact is positioned between the two adjacent $t^{th}$ cell mats.

3. The electronic device according to claim 1, wherein a combination of the $t^{th}$ lower contact and the $t^{th}$ lower line, a combination of the $t^{th}$ upper contact and the $t^{th}$ upper line, and a combination of the $(t+1)^{th}$ upper contact and the $(t+1)^{th}$ upper line have T-shaped cross-sections, respectively.

4. The electronic device according to claim 1, wherein each of the $t^{th}$ cell mat and the $(t+1)^{th}$ cell mat is divided into four quadrants in the first and second directions, and
wherein the $t^{th}$ lower contact, the $t^{th}$ upper contact, and the $(t+1)^{th}$ upper contact are positioned at boundaries of the four quadrants.

5. The electronic device according to claim 1, wherein, among the first to Tth planes, $(4n+1)^{th}$ planes overlap with each other, $(4n+2)^{th}$ planes overlap with each other, $(4n+3)^{th}$ planes overlap with each other, and $(4n+4)^{th}$ planes overlap with each other, in a plan view, n being 0 or a positive integer.

6. The electronic device according to claim 1, wherein the semiconductor memory unit further comprises:
a selection element interposed between the $t^{th}$ variable resistance element and the $t^{th}$ lower or upper line or between the $t^{th}$ variable resistance element and each of the $t^{th}$ lower and upper lines; and
a selection element interposed between the $(t+1)^{th}$ variable resistance element and the $t^{th}$ or $(t+1)^{th}$ upper line or between the $(t+1)^{th}$ variable resistance element and each of the $t^{th}$ and $(t+1)^{th}$ upper lines.

7. The electronic device according to claim 1, wherein a $(t+2)^{th}$ cell mat of a $(t+2)^{th}$ plane overlaps with a first quadrant of a first one of four adjacent $t^{th}$ cell mats which are adjacent to each other in the first and second directions, a second quadrant of a second one of the four adjacent $t^{th}$ cell mats, a third quadrant of a third one of the four adjacent $t^{th}$ cell mats, and a fourth quadrant of a fourth one of the four adjacent $t^{th}$ cell mats, the first to fourth quadrants being adjacent to each other in the first and second directions, and wherein a $(t+3)^{th}$ cell mat of a $(t+3)^{th}$ plane overlaps with a first half of one of two $t^{th}$ cell mats which are adjacent to each other in the second direction and a second half of the other of said two adjacent $t^{th}$ cell mats, the second half being adjacent to the first half in the second direction.

8. The electronic device according to claim 1, further comprising a microprocessor which includes:
    a control unit configured to receive a signal including a command from an external device, and performs extracting, decoding of the command, or controlling input or output of a signal of the microprocessor;
    an operation unit configured to perform an operation based on a result that the control unit decodes the command; and
    a memory unit configured to store data for performing the operation, data corresponding to a result of performing the operation, or an address of data for which the operation is performed,
    wherein the semiconductor memory unit is a part of the memory unit in the microprocessor.

9. The electronic device according to claim 1, further comprising a processor which includes:
    a core unit configured to perform, based on a command inputted from an external device, an operation corresponding to the command, by using data;
    a cache memory unit configured to store data for performing the operation, data corresponding to a result of performing the operation, or an address of data for which the operation is performed; and
    a bus interface connected between the core unit and the cache memory unit, and configured to transmit data between the core unit and the cache memory unit,
    wherein the semiconductor memory unit is a part of the cache memory unit in the processor.

10. The electronic device according to claim 1, further comprising a processing system which includes:
    a processor configured to decode a command received by the processor and control an operation for information based on a result of decoding the command;
    an auxiliary memory device configured to store a program for decoding the command and the information;
    a main memory device configured to call and store the program and the information from the auxiliary memory device such that the processor can perform the operation using the program and the information when executing the program; and
    an interface device configured to perform communication between at least one of the processor, the auxiliary memory device and the main memory device and an external device,
    wherein the semiconductor memory unit is a part of the auxiliary memory device or the main memory device in the processing system.

11. The electronic device according to claim 1, further comprising a data storage system which includes:
    a storage device configured to store data and conserve stored data regardless of power supply;
    a controller configured to control input and output of data to and from the storage device according to a command inputted from an external device;
    a temporary storage device configured to temporarily store data exchanged between the storage device and the external device; and
    an interface configured to perform communication between at least one of the storage device, the controller and the temporary storage device and the external device,
    wherein the semiconductor memory unit is a part of the storage device or the temporary storage device in the data storage system.

12. The electronic device according to claim 1, further comprising a memory system which includes:
    a memory configured to store data and conserve stored data regardless of power supply;
    a memory controller configured to control input and output of data to and from the memory according to a command inputted from an external device;
    a buffer memory configured to buffer data exchanged between the memory and the external device; and
    an interface configured to perform communication between at least one of the memory, the memory controller and the buffer memory and the external device,
    wherein the semiconductor memory unit is a part of the memory or the buffer memory in the memory system.

13. An electronic device comprising a semiconductor memory unit, the semiconductor memory unit comprising:
    a cell mat disposed over a substrate and including lower lines, upper lines crossing the lower lines and variable resistance elements disposed between the lower lines and the upper lines and disposed in intersection regions between the lower lines and the upper lines, respectively, wherein the cell mat has a first boundary region positioned between half of the lower lines and the other half of the lower lines and a second boundary region positioned between half of the upper lines and the other half of the upper lines;
    a plurality of lower contacts each coupled to a corresponding one of the lower lines and overlapping with the second boundary region; and
    a plurality of upper contacts each coupled to a corresponding one of the upper lines and overlapping with the first boundary region,
    wherein a number of variable resistance elements coupled to the half of the lower lines is the same as a number of variable resistance elements coupled to the other half of the lower lines, and
    wherein a number of variable resistance elements coupled to the half of the upper lines is the same as a number of variable resistance elements coupled to the other half of the upper lines.

14. The electronic device according to claim 13, wherein a combination of the lower contact and the lower line, and a combination of the upper contact and the upper line have T-shaped cross-sections, respectively.

* * * * *